(12) United States Patent
Kabayama et al.

(10) Patent No.: US 6,998,733 B2
(45) Date of Patent: Feb. 14, 2006

(54) PULSE CURRENT GENERATION CIRCUIT

(75) Inventors: Taiji Kabayama, Tokyo (JP); Motokuni Saeki, Tokyo (JP); Takehiko Umeyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 398 days.

(21) Appl. No.: 10/265,604

(22) Filed: Oct. 8, 2002

(65) Prior Publication Data

US 2003/0210084 A1  Nov. 13, 2003

(30) Foreign Application Priority Data

May 7, 2002  (JP) .............................. 2002-131529

(51) Int. Cl.
*H03K 3/00* (2006.01)
*H03K 23/42* (2006.01)

(52) U.S. Cl. ........................................ 307/106
(58) Field of Classification Search ................ 307/106; 398/182
See application file for complete search history.

(56) References Cited

U.S. PATENT DOCUMENTS

| 5,006,725 A * | 4/1991 | Nawaki et al. ............. 307/106 |
| 5,036,232 A | 7/1991 | Jungert et al. |
| 5,231,311 A * | 7/1993 | Ferry et al. ................... 326/27 |
| 6,313,678 B1 * | 11/2001 | Hinterscher ................. 327/170 |
| 6,795,656 B1 * | 9/2004 | Ikeuchi et al. .............. 398/197 |

FOREIGN PATENT DOCUMENTS

| JP | 2-206913 | 8/1990 |
| JP | 2-246513 | 10/1990 |
| JP | 3-62723 | 3/1991 |
| JP | 3-191615 | 8/1991 |
| JP | 4-123482 | 4/1992 |
| JP | 2000-216480 | 8/2000 |

* cited by examiner

*Primary Examiner*—Lynn Feild
*Assistant Examiner*—Michael Rutland-Wallis
(74) *Attorney, Agent, or Firm*—Leydig, Voit & Mayer, Ltd.

(57) ABSTRACT

An N-transistor switches a current of a first constant current source by a positive input pulse to generate an output pulse current where an overshoot and an undershoot appear. A P-transistor switches a current of a second constant current source by a negative correction pulse applied at timing of occurrence of the overshoot to generate a correction pulse current. Another N-transistor switches a current of a third constant current source by a positive correction pulse applied at timing of occurrence of the undershoot to generate a correction pulse current. These correction pulse currents are added to the output pulse current to obtain a current as a wavelength where the overshoot and undershoot are largely reduced.

10 Claims, 18 Drawing Sheets

(1) INPUT WAVEFORM OF TRANSISTOR 5
(INPUT PULSE a)

(2) OUTPUT CURRENT OF TRANSISTOR 4

(3) INPUT WAVEFORM OF TRANSISTOR 2
(CORRECTION PULSE b)

(4) OUTPUT CURRENT OF TRANSISTOR 3

(5) INPUT WAVEFORM OF TRANSISTOR 7
(CORRECTION PULSE c)

(6) OUTPUT CURRENT OF TRANSISTOR 6

(7) COMPOSITE OUTPUT PULSE CURRENT

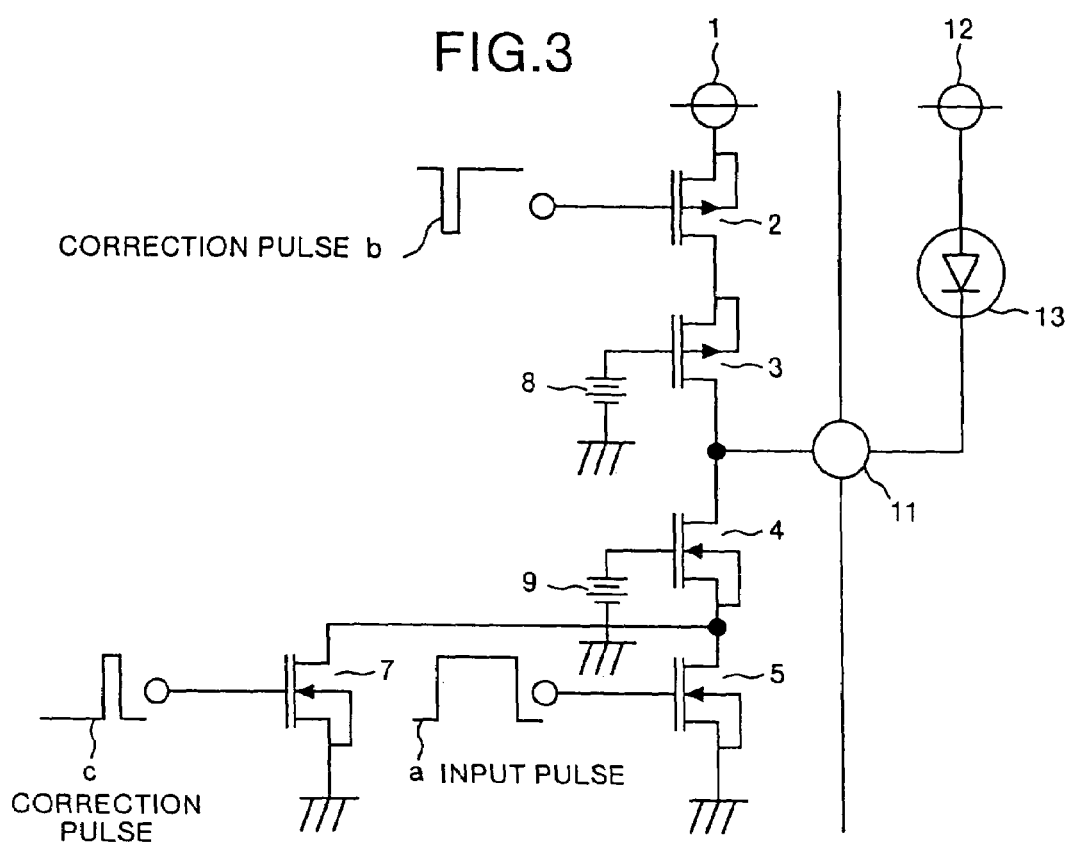
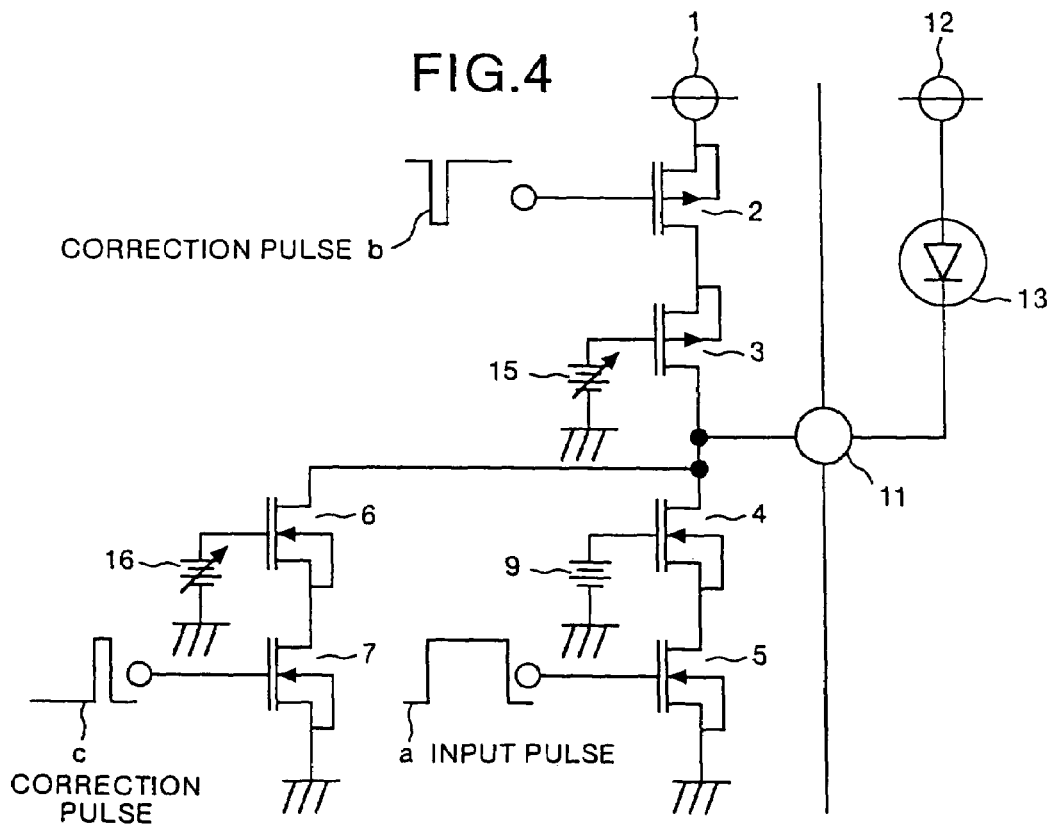

(1) INPUT PULSE a (2) CURRENT GENERATED BY PULSE CURRENT + SPEED-UP CURRENT (3) CURRENT GENERATED BY INPUT PULSE (4) OVERSHOOT AND UNDERSHOOT IMPROVEMENT CURRENT (5) SPEED-UP CURRENT (6) OUTPUT WAVEFORM OF TRANSISTOR 3

(7) OUTPUT WAVEFORM OF TRANSISTOR 6

(8) CORRECTION PULSE e (9) CORRECTION PULSE d

(10) COMPOSITE OUTPUT PULSE CURRENT (1) INPUT WAVEFORM OF TRANSISTOR 23
(INPUT PULSE a)

(2) OUTPUT CURRENT OF TRANSISTOR 22

(3) INPUT WAVEFORM OF TRANSISTOR 21
(CORRECTION PULSE b)

(4) OUTPUT CURRENT OF TRANSISTOR 21

(5) INPUT WAVEFORM OF TRANSISTOR 24
(CORRECTION PULSE c)

(6) OUTPUT CURRENT OF TRANSISTOR 24

(7) COMPOSITE OUTPUT PULSE CURRENT (1) INPUT PULSE a (2) CURRENT GENERATED BY PULSE
    CURRENT + SPEED-UP CURRENT (3) CURRENT GENERATED BY INPUT PULSE (4) OVERSHOOT AND UNDERSHOOT
    IMPROVEMENT CURRENT (5) SPEED-UP CURRENT (6) OUTPUT WAVEFORM OF TRANSISTOR 21

(7) OUTPUT WAVEFORM OF TRANSISTOR 24

(8) CORRECTION PULSE e (9) CORRECTION PULSE d

(10) COMPOSITE OUTPUT PULSE CURRENT

US 6,998,733 B2

PULSE CURRENT GENERATION CIRCUIT

BACKGROUND OF THE INVENTION

1) Field of the Invention

The present invention relates to a technology for generating a high-frequency pulse current in order to drive a laser diode or the like.

2) Description of the Related Art

FIG. 19 is a circuit diagram that shows a configuration example of a conventional pulse current generation circuit formed of an integrated circuit with MOS transistors. However, a configuration example of bipolar transistors is not shown.

As shown in FIG. 19, this pulse current generation circuit includes NMOS transistors 101 and 102, and a bias voltage source 103. A laser diode 106 is connected to an IC output terminal 104 and an external power supply 105. A snubber circuit 107 is connected in parallel with the laser diode (LD) 106.

A bias voltage of a positive polarity is input from the bias voltage source 103 to the NMOS transistor 101 at its gate electrode. The NMOS transistor 101 is connected at its drain electrode to the IC output terminal 104 and connected at its source electrode to the NMOS transistor 102 at its drain electrode. The NMOS transistor 102 is connected at its source electrode to ground (GND). An input pulse p having a predetermined pulse width is applied to the NMOS transistor 102 at its gate electrode.

In the configuration heretofore explained, the bias voltage of the positive polarity is applied from the bias voltage source 103 to the gate electrode of the NMOS transistor 101. Thus, the NMOS transistor 101 is in the ON state, and forms a constant current source that flows a preset constant current. When the input pulse p is applied to the gate electrode of the NMOS transistor 102 and the NMOS transistor 102 turns ON, the LCD 106 is connected at its cathode to ground (GND) via the NMOS transistors 101 and 102.

Accordingly, the LD 106 turns ON. A pulse current having a pulse width equivalent to that of the input pulse p flows to the ground (GND) via the LD 106 and the NMOS transistors 101 and 102. In other words, when the NMOS transistor 102 is turned ON by the input pulse p, an output pulse current having the pulse width is applied to the LD 106, and consequently the LD 106 is subjected to pulse driving.

If the slew rate becomes high in pulse light emission of the LD 106, then overshoots, undershoots, and ringings occur due to parasitic inductance components of an IC substrate. In the worst instance, the LD 106 is destroyed.

In the conventional art, therefore, there is adopted a method of connecting the snubber circuit 107, which is a filter made up of a series circuit consisting of a resistor and a capacitor, in parallel with the LD 106 as shown in FIG. 19 in order to reduce the overshoots, undershoots, and ringings.

In the method of externally providing the snubber circuit 107 in order to reduce the overshoots, undershoots, and ringings, however, the number of components increases and requires much labor to set constants of the snubber circuit 107. Due to addition of the snubber circuit 107, the slew rate is lowered. This results in a problem that the data transfer rate cannot be increased in application to communication or storage.

On the other hand, when a distributed parameter circuit can be supposed as in long external wiring, there is a method of effecting impedance matching and thereby reducing overshoots, undershoots, and ringings caused by reflection. This method is used frequently when wiring impedance is not so high and a pulse voltage is output with low output impedance. It is difficult to effect matching in an IC because it is necessary to make the impedance of external wiring a certain constant value. In other words, the pulse generation type is comparatively high in output impedance, and consequently the impedance matching technique cannot be adopted.

SUMMARY OF THE INVENTION

It is an object of the present invention to provide a pulse current generation circuit that obviates the need of a component provided outside, that can improve overshoots and undershoots owing to processing conducted within an IC, and that can generate a pulse current having a high slew rate.

The pulse current generation circuit according to one aspect of this invention, includes a first N-type transistor that is connected at a first signal electrode thereof to an output terminal of an output pulse current and that functions as a first constant current source according to a bias voltage of a positive polarity, and a second N-type transistor that is connected to a second signal electrode of the first N-type transistor and ground and that switches a current of the first constant current source in response to an input pulse of a positive polarity and thus generates the output pulse current. The circuit also includes a first P-type transistor that is connected at a first signal electrode thereof to the output terminal and that functions as a second constant current source according to a bias voltage of a negative polarity, and a second P-type transistor that is connected to a second signal electrode of the first P-type transistor and a power supply and that switches a current of the second constant current source in response to a first correction pulse of a negative polarity applied thereto at timing of occurrence of an overshoot in the output pulse current and thus generates a first correction pulse current. The circuit further includes a third N-type transistor that is connected at a first signal electrode thereof to the output terminal and that functions as a third constant current source according to a bias voltage of a positive polarity, and a fourth N-type transistor that is connected to a second signal electrode of the third N-type transistor and the ground and that switches a current of the third constant current source in response to a second correction pulse of a positive polarity applied thereto at timing of occurrence of an undershoot in the output pulse current and thus generates a second correction pulse current.

The pulse current generation circuit according to another aspect of this invention, includes a first N-type transistor that is connected at a first signal electrode thereof to an output terminal of an output pulse current and that functions as a first constant current source according to a bias voltage of a positive polarity, and a second N-type transistor that is connected to a second signal electrode of the first N-type transistor and ground and that switches a current of the first constant current source in response to an input pulse of a positive polarity and thus generates the output pulse current. The circuit also includes a first P-type transistor that is connected at a first signal electrode thereof to the output terminal and that functions as a second constant current source according to a bias voltage of a negative polarity, and a second P-type transistor that is connected to a second signal electrode of the first P-type transistor and a power supply and that switches a current of the second constant current source in response to a first correction pulse of a negative polarity applied thereto at timing of occurrence of an overshoot in the output pulse current and thus generates a first correction pulse current. The circuit further includes a third N-type transistor that is connected to a second signal electrode of the first N-type transistor and the ground and that switches a current of the first constant current source in response to a second correction pulse of a positive polarity applied thereto at timing of occurrence of an undershoot in the output pulse current and thus generates a second correction pulse current.

The pulse current generation circuit according to still another aspect of this invention, includes a first N-type transistor that is connected at a first signal electrode thereof to an output terminal of an output pulse current and that functions as a first constant current source according to a bias voltage of a positive polarity, and a second N-type transistor that is connected to a second signal electrode of the first N-type transistor and ground and that switches a current of the first constant current source in response to an input pulse of a positive polarity and thus generates the output pulse current. The circuit also includes a P-type transistor that is connected to a power supply and the output terminal and that conducts a switching operation in response to a first correction pulse of a negative polarity applied thereto at timing of occurrence of an overshoot in the output pulse current and thus generates a first correction pulse current, and a third N-type transistor that is connected to the output terminal and the ground and that conducts a switching operation in response to a second correction pulse of a positive polarity applied thereto at timing of occurrence of an undershoot in the output pulse current and thus generates a second correction pulse current.

The pulse current generation circuit according to still another aspect of this invention, includes a CMOS inverter that inverts an input pulse applied thereto and outputs the inverted pulse, a current source, and a current mirror circuit that supplies an output current of the current source to the CMOS inverter. The circuit also includes a first N-type transistor that is connected at a first signal electrode thereof to an output terminal of an output pulse current and that functions as a constant current source according to a bias voltage of a positive polarity, and a second N-type transistor that is connected to a second signal electrode of the first N-type transistor and ground and that switches a current of the constant current source in response to an output of the CMOS inverter and thus generates the output pulse current.

The pulse current generation circuit according to still another invention, includes first and second N-type transistors that are each connected at a first signal electrode thereof to an output terminal of an output pulse current and that function respectively as first and second constant current sources according to a bias voltage of a positive polarity. The circuit also includes a third N-type transistor that is connected to a second signal electrode of the first N-type transistor and ground and that switches a current of the first constant current source in response to an input pulse of a positive polarity and thus generates the output pulse current, and a fourth N-type transistor that is connected to a second signal electrode of the second N-type transistor and the ground and that conducts a switching operation in response to a correction pulse of a positive polarity provided with a valley portion at timing of occurrence of an overshoot in the output pulse current and with a hill portion at timing of occurrence of an undershoot in the output pulse current, and thus generates a correction pulse current.

The pulse current generation circuit according to still another aspect of this invention, includes a first N-type transistor that is connected at a first signal electrode thereof to an output terminal of an output pulse current and that functions as a first constant current source according to a bias voltage of a positive polarity, and a second N-type transistor that is connected to a second signal electrode of the first N-type transistor and ground and that switches a current of the first constant current source in response to an input pulse of a positive polarity and thus generates the output pulse current. The circuit also includes a third N-type transistor that is connected to the output terminal and the ground and that conducts a switching operation in response to a correction pulse of a positive polarity provided with a valley portion at timing of occurrence of an overshoot in the output pulse current and with a hill portion at timing of occurrence of an undershoot in the output pulse current, and thus generates a correction pulse current.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 is a circuit diagram that shows a configuration of a pulse current generation circuit according to a second embodiment of the present invention, FIG. 4 is a circuit diagram that shows a configuration of a pulse current generation circuit according to a third embodiment of the present invention.

DETAILED DESCRIPTION

Embodiments of the pulse current generation circuit according to the present invention will be explained in detail below with reference to accompanying drawings.

Figure 1:
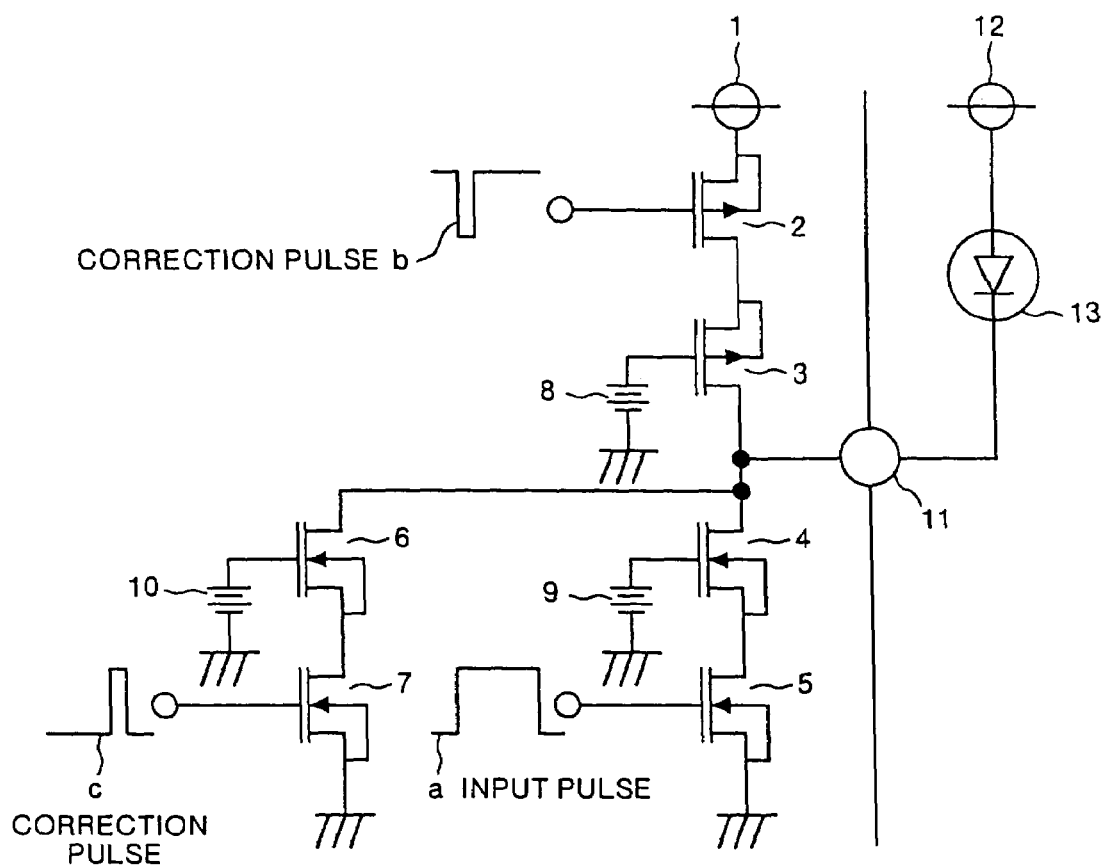
FIG. 1 is a circuit diagram that shows a configuration of a pulse current generation circuit according to a first embodiment of the present invention.
Figure 19:
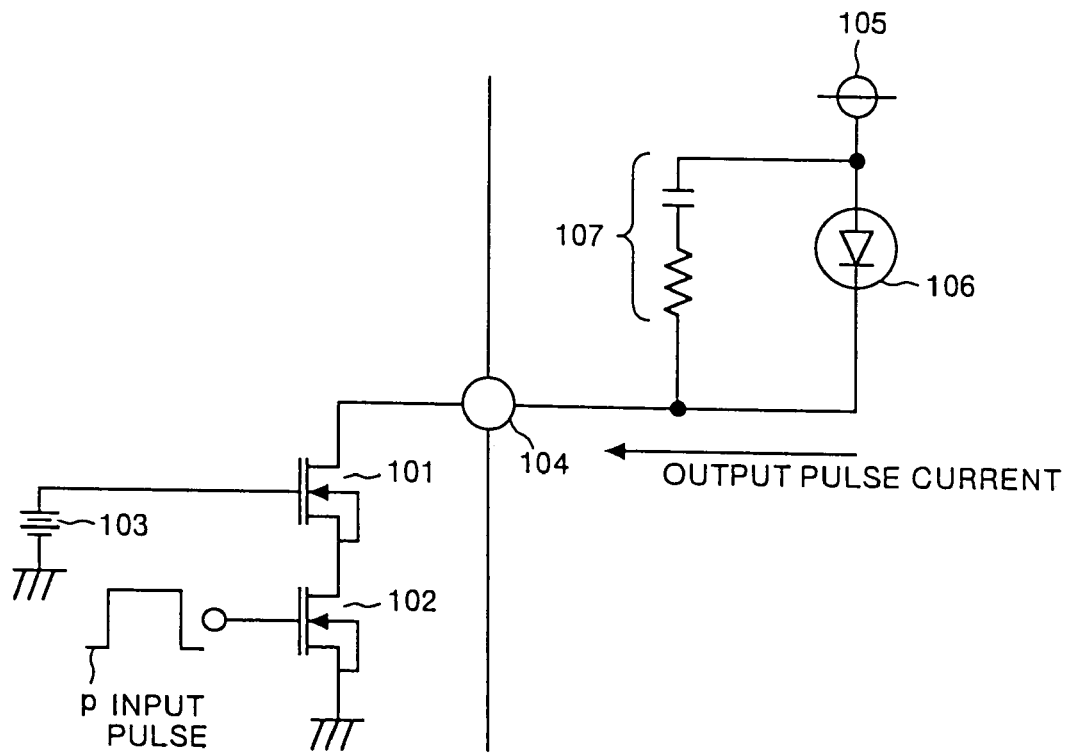
FIG. 19 is a circuit diagram that shows a configuration example of a pulse current generation circuit formed of a conventional integrated circuit.

A first embodiment of this invention will be explained below. FIG. 1 is a circuit diagram that shows the configuration of a pulse current generation circuit according to the first embodiment. As shown in FIG. 1, the first embodiment of the pulse current generation circuit includes PMOS transistors 2 and 3 and NMOS transistors 4 and 5 connected in series between a power supply 1 and ground (GND), NMOS transistors 6 and 7 connected in parallel with the NMOS transistors 4 and 5, and bias voltage sources 8, 9 and 10. A laser diode 13 is connected to an IC output terminal 11 and an external power supply 12. The external snubber circuit 107 shown in FIG. 19 is not provided.

The PMOS transistor 2 is connected at its source electrode to the power supply 1, and connected at its drain electrode to the PMOS transistor 3 at its source electrode. A narrow pulse of a negative polarity (correction pulse "b") is applied to the PMOS transistor 2 at its gate electrode.

A bias voltage of a negative polarity from the bias voltage source 8 is applied to the PMOS transistor 3 at its gate electrode. The PMOS transistor 3 is connected at its drain electrode to the IC output terminal 11 and to drain electrodes of the NMOS transistors 4 and 6.

A bias voltage of a positive polarity from the bias voltage source 9 is applied to the NMOS transistor 4 at its gate electrode. The NMOS transistor 4 is connected at its source electrode to the NMOS transistor 5 at its drain electrode. The NMOS transistor 5 is connected at its source electrode to the ground (GND). An input pulse "a" having a predetermined pulse width is applied to the NMOS transistor 5 at its gate electrode.

The NMOS transistor 6 is connected at its source electrode to the NMOS transistor 7 at its drain electrode. The NMOS transistor 7 is connected at its source electrode to the ground (GND). A bias voltage of a positive polarity from the bias voltage source 10 is applied to the NMOS transistor 6 at its gate electrode. A narrow pulse of a positive polarity (correction pulse "c") is applied to the NMOS transistor 7 at its gate electrode.

Figure 2:
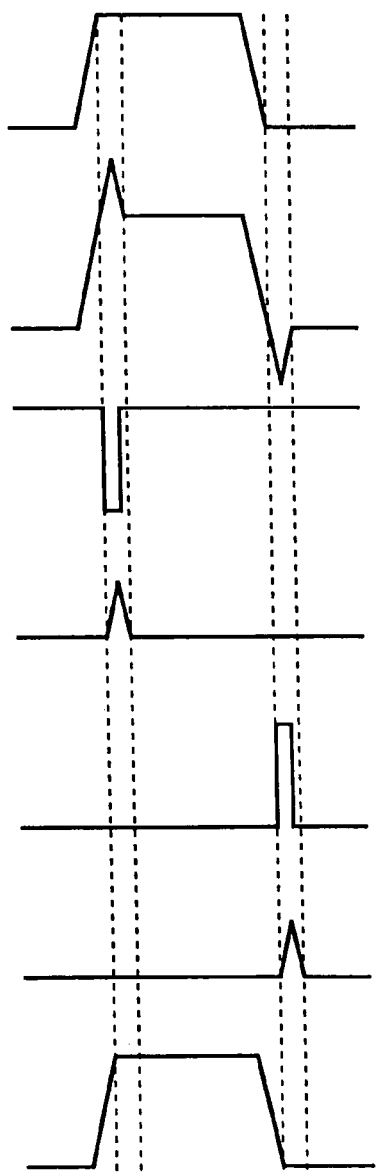
FIG. 2 is a waveform diagram that explains an operation of the pulse current generation circuit shown in FIG. 1.

Operation of the pulse current generation circuit of the first embodiment will now be explained with reference to FIGS. 1 and 2. FIG. 2 is a waveform diagram that shows the operation of the pulse current generation circuit shown in FIG. 1.

The bias voltage of the negative polarity from the bias voltage source 8 is applied to the gate electrode of the PMOS transistor 3. The PMOS transistor 3 is in the ON operation state, and the PMOS transistor 3 forms a constant current source that flows a preset constant current. A pulse current is output from the PMOS transistor 3 by ON/OFF operation of the PMOS transistor 2.

The gate electrodes of the NMOS transistors 4 and 6 are supplied with the bias voltages of the positive polarity respectively from the bias voltage sources 9 and 10. Each of the NMOS transistors 4 and 6 is thus in the ON operation state, and forms a constant current source that flows a preset constant current. Pulse currents are output from the NMOS transistors 4 and 6 by ON/OFF operation of the NMOS transistors 5 and 7.

The input pulse "a" of the positive polarity as shown in (1) of FIG. 2 is applied to the gate electrode of the NMOS transistor 5. As a result, the constant current source formed of the NMOS transistor 4 is turned ON/OFF, and a pulse current is generated. As shown in (2) of FIG. 2, an overshoot occurs on a rising edge of the waveform of the pulse current (the output current of the NMOS transistor 4) and an undershoot occurs on a falling edge.

At the overshoot occurrence timing of the output current of the NMOS transistor 4, therefore, a narrow pulse of a negative polarity (the correction pulse "b") as shown in (3) of FIG. 2 is applied to the gate electrode of the PMOS transistor 2. As a result, a current that has a waveform corresponding to the overshoot that has occurred on the rising edge of the output current of the NMOS transistor 4 is obtained in the output current of the PMOS transistor 3 as shown in (4) of FIG. 2. By adding the output current of the NMOS transistor 4 and the output current of the PMOS transistor 3 together, the overshoot that has occurred on the rising edge of the output current of the NMOS transistor 4 is reduced, because currents are added caused by switching of constant current sources in opposite directions.

At the undershoot occurrence timing of the output current of the NMOS transistor 4, a narrow pulse of a positive polarity (the correction pulse "c") as shown in (5) of FIG. 2 is applied to the gate electrode of the NMOS transistor 7. As a result, a current that has a waveform corresponding to the undershoot that has occurred on the falling edge of the output current of the NMOS transistor 4 is obtained in the output current of the NMOS transistor 6 as shown in (6) of FIG. 2. By adding the output current of the NMOS transistor 4 and the output current of the NMOS transistor 6 together, the undershoot that has occurred on the falling edge of the output current of the NMOS transistor 4 is reduced.

A composite output pulse current output to the IC output terminal 11 has a waveform remarkably improved in overshoot and undershoot as shown in (7) of FIG. 2.

Thus, in the pulse current generation circuit of the first embodiment, a pulse current improved in overshoot and undershoot is obtained without using a component provided outside.

A second embodiment of this invention will be explained below. FIG. 3 is a circuit diagram that shows the configuration of a pulse current generation circuit according to the second embodiment. In FIG. 3, components that are the same as or equivalent to the components shown in the first embodiment (FIG. 1) are denoted by like characters. A portion that concerns the second embodiment will now be explained mainly.

As shown in FIG. 3, the pulse current generation circuit of the second embodiment is obtained by omitting the NMOS transistor 6 and the bias voltage source 10 in the configuration of the first embodiment (FIG. 1) and connecting the drain electrode of the NMOS transistor 7 to a node between the source electrode of the NMOS transistor 4 and the drain electrode of the NMOS transistor 5.

In the first embodiment, the correction current for reducing the undershoot is generated by the NMOS transistor 6 that forms a constant current source. Instead, in the second embodiment, the constant current source formed of the NMOS transistor 4 that generates the basic pulse current is utilized and ON resistance connected to the source electrode of the NMOS transistor 4 is changed.

In this configuration as well, an operation and an effect similar to those of the first embodiment are obtained. In the second embodiment, it is necessary to optimize the quantity of correction current for undershoot reduction by adjusting the transistor size. Since the NMOS transistors 4 and 7 are connected in a cascade form and the number of constant current sources is reduced by one, the slew rate of the output pulse current is improved as compared with the first embodiment.

A third embodiment of this invention will be explained below. FIG. 4 is a circuit diagram that shows the configuration of a pulse current generation circuit according to the third embodiment. In FIG. 4, components that are the same as or equivalent to those shown in the first embodiment (FIG. 1) are denoted by like characters. A portion that concerns the third embodiment will now be explained mainly.

As shown in FIG. 3, the pulse current generation circuit of the third embodiment is obtained by providing a variable bias voltage source 15 instead of the bias voltage source 8 that concerns the constant current source provided to improve the overshoot in the configuration shown in the first embodiment (FIG. 1) and providing a variable bias voltage source 16 instead of the bias voltage source 10 that concerns the constant current source provided to improve the undershoot.

According to this configuration, the correction currents of the overshoot correction circuit and the undershoot correction circuit can be varied, and consequently it becomes possible to conduct optimum setting.

Figure 5:
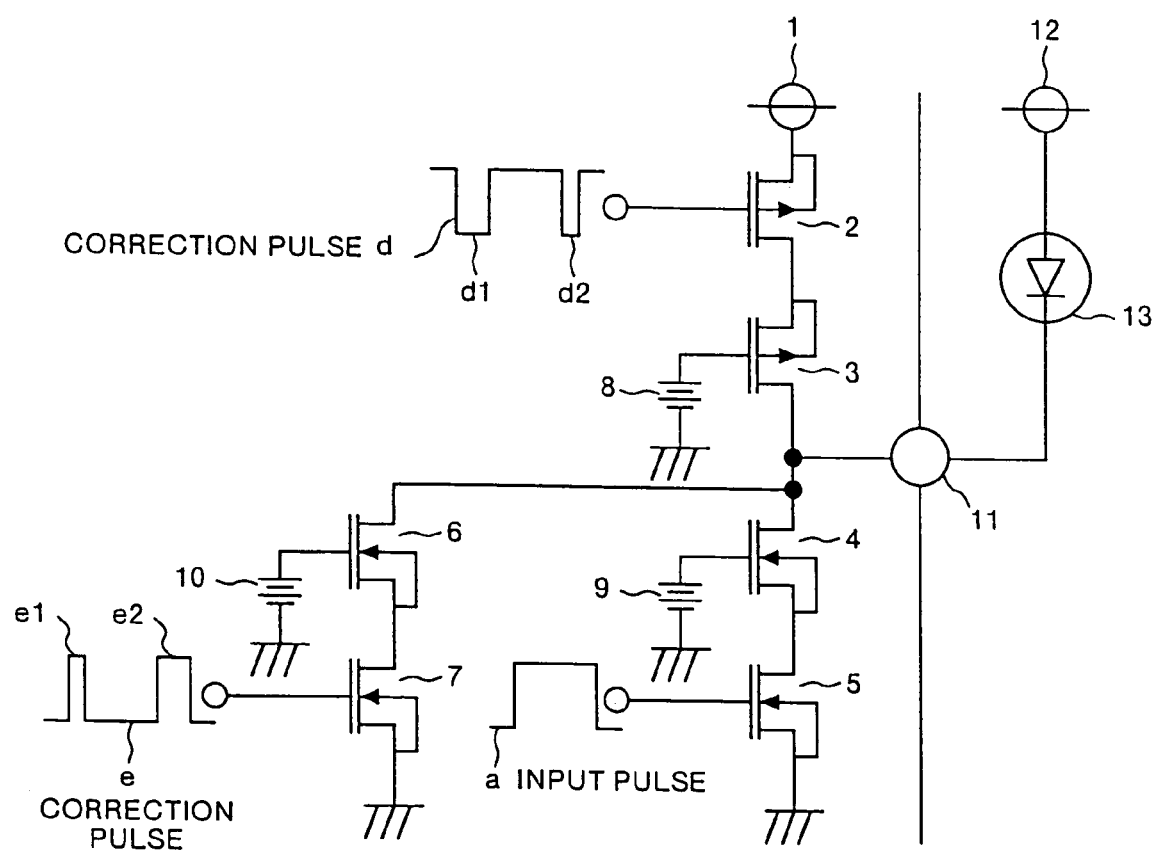
FIG. 5 is a circuit diagram that shows a configuration of a pulse current generation circuit according to a fourth embodiment of the present invention.

A fourth embodiment of this invention will be explained below. FIG. 5 is a circuit diagram that shows the configuration of a pulse current generation circuit according to the fourth embodiment. In FIG. 5, components that are the same as or equivalent to those shown in the first embodiment (FIG. 1) are denoted by like characters. A portion that concerns the fourth embodiment will now be explained mainly.

As shown in FIG. 5, the pulse current generation circuit of the fourth embodiment has the same configuration as that of the first embodiment (FIG. 1). There are difference points that a correction pulse "d" is used instead of the correction pulse "b" as the correction pulse of the negative polarity applied to the gate electrode of the PMOS transistor 2, and that a correction pulse "e" is used instead of the correction pulse "c" as the correction pulse of the positive polarity applied to the gate electrode of the NMOS transistor 7.

The correction pulse "d" includes a first pulse d1 that has a wide pulse width and a second pulse d2 that has a narrow pulse width. The first pulse d1 is applied at the timing of occurrence of the overshoot, which appears in the output pulse current. The second pulse d2 is applied at the timing of occurrence of the undershoot.

The correction pulse "e" includes a first pulse e1 that has a narrow pulse width and a second pulse e2 that has a wide pulse width. The first pulse e1 is applied at the timing of occurrence of the overshoot, which appears in the output pulse current. The second pulse e2 is applied at the timing of occurrence of the undershoot.

Figure 6:
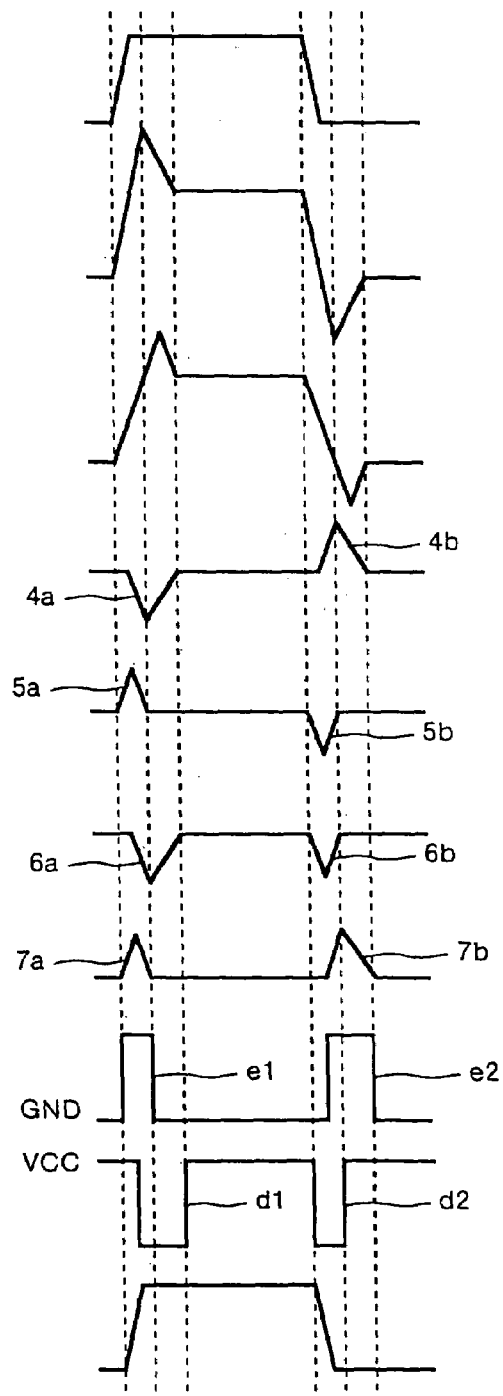
FIG. 6 is a waveform diagram that explains an operation of the pulse current generation circuit shown in FIG. 5.

Operation of the pulse current generation circuit of the fourth embodiment will now be explained with reference to FIGS. 5 and 6. FIG. 6 is a waveform diagram that shows the operation of the pulse current generation circuit shown in FIG. 5.

The bias voltage of the negative polarity from the bias voltage source 8 is applied to the gate electrode of the PMOS transistor 3. The PMOS transistor 3 is in the ON operation state, and the PMOS transistor 3 forms a constant current source that flows a preset constant current. A pulse current is output from the PMOS transistor 3 by ON/OFF operation of the PMOS transistor 2.

The gate electrodes of the NMOS transistors 4 and 6 are applied with the bias voltages of the positive polarity respectively from the bias voltage sources 9 and 10. Each of the NMOS transistors 4 and 6 is thus in the ON operation state, and forms a constant current source that flows a preset constant current. Pulse currents are output from the NMOS transistors 4 and 6 by ON/OFF operation of the NMOS transistors 5 and 7.

The input pulse "a" of the positive polarity as shown in (1) of FIG. 6 is applied to the gate electrode of the NMOS transistor 5. As a result, the constant current source formed of the NMOS transistor 4 is turned ON/OFF to generate a pulse current. As shown in (3) of FIG. 6, an overshoot occurs on a rising edge of the waveform of the pulse current (the output current of the NMOS transistor 4) and an undershoot occurs on a falling edge thereof.

The correction pulse "e" that has a waveform shown in (8) of FIG. 6 is applied to the gate electrode of the NMOS transistor 7. The correction pulse "d" that has a waveform shown in (9) of FIG. 6 is applied to the gate electrode of the PMOS transistor 2. On a rising edge of the input pulse "a", the following operation is conducted.

The first pulse e1 of the correction pulse "e" rises in synchronism with the rising edge of the input pulse "a". The first pulse e1 has a waveform that falls immediately after the input pulse "a" has risen and that is comparatively narrow in pulse width. An output current of the NMOS transistor 6 as represented by 7a in (7) of FIG. 6 is generated by the first pulse e1.

On the other hand, the first pulse d1 of the correction pulse "d" has a waveform that falls after a rising edge of the first pulse e1 and rises when a certain time of period has elapsed after the rising of the input pulse "a" and that is comparatively wide in pulse width. An output current of the PMOS transistor 3 as represented by 6a in (6) of FIG. 6 is generated by the first pulse d1.

Since the first pulse e1 is applied before the first pulse d1, the output current 7a generated by the first pulse e1 is added to a current generated by the input pulse "a" and shown in (3) of FIG. 6, as a speed-up current 5a shown in (5) of FIG. 6. The generation timing of the speed-up current 5a precedes the generation timing of the overshoot. As shown in (2) of FIG. 6, therefore, the rising edge of the output pulse current becomes steep and the waveform becomes such that the overshoot quantity increases.

Thereafter, the output current 6a generated by the first pulse d1 is added to the output pulse current increased in overshoot quantity ((2) of FIG. 6) as an overshoot improvement current 4a shown in (4) of FIG. 6. The pulse width of the first pulse d1 is made wide to such a degree that a current quantity required to reduce the overshoot is obtained.

The first pulse e1 and the first pulse d1 overlap each other. There is a time period during which the NMOS transistor 7 and the PMOS transistor 2 are in the ON state simultaneously. Therefore, the speed-up in the rising and the overshoot reduction are executed as a series of consecutive, operations.

On a falling edge of the input pulse "a", the following operation is conducted. The second pulse d2 of the correction pulse "d" has a waveform that falls in synchronism with the falling edge of the input pulse "a" and rises immediately after the input pulse "a" has fallen and that is comparatively narrow in pulse width. An output current of the PMOS transistor 3 as represented by 6b in (6) of FIG. 6 is generated by the second pulse d2.

On the other hand, the second pulse e2 of the correction pulse "e" has a waveform that rises after a falling edge of the second pulse d2 and falls when a certain time of period has elapsed after the falling of the input pulse "a" and that is comparatively wide in pulse width. An output current of the NMOS transistor 6 as represented by 7b in (7) of FIG. 6 is generated by the second pulse e2.

Since the second pulse d2 is applied before the second pulse e2, the output current 6b generated by the second pulse d2 is added to a current generated by the input pulse "a" and shown in (3) of FIG. 6, as a speed-up current 5b shown in (5) of FIG. 6. The generation timing of the speed-up current 5b precedes the generation timing of the undershoot. As shown in (2) of FIG. 6, therefore, the falling edge of the output pulse current becomes steep and the waveform becomes such that the undershoot quantity increases.

Thereafter, the output current 7b generated by the second pulse e2 is added to the output pulse current increased in undershoot quantity ((2) of FIG. 6) as an undershoot improvement current 4b shown in (4) of FIG. 6. The pulse width of the second pulse e2 is made wide to such a degree that a current quantity required to reduce the undershoot is obtained.

The second pulse e2 and the second pulse d2 overlap each other. There is a time period during which the NMOS transistor 7 and the PMOS transistor 2 are in the ON state simultaneously. Therefore, the speed-up in the falling and the undershoot reduction are executed as a series of consecutive operations.

Thus, in the pulse current generation circuit of the fourth embodiment, the slew rate of the composite output pulse current waveform is increased in addition to the improvement of the overshoot and undershoot.

Figure 7:
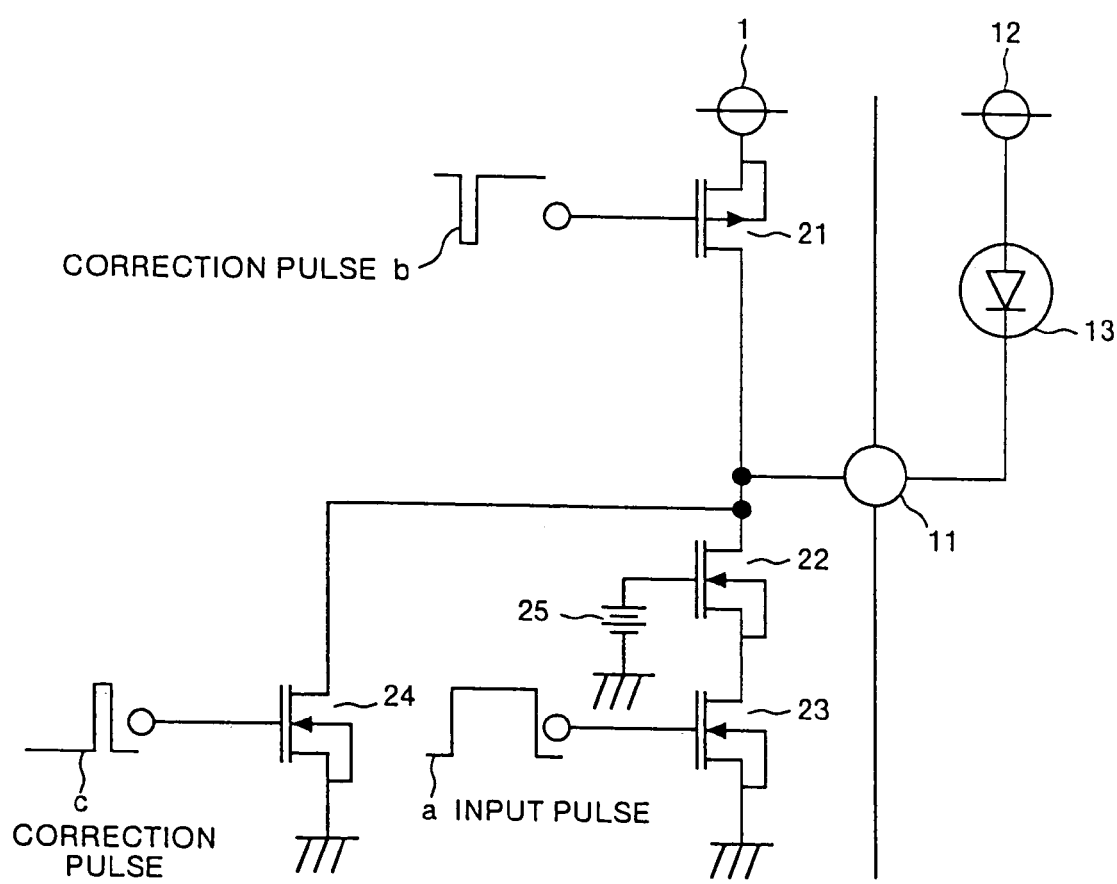
FIG. 7 is a circuit diagram that shows a configuration of a pulse current generation circuit according to a fifth embodiment of the present invention.

A fifth embodiment of this invention will be explained below. FIG. 7 is a circuit diagram that shows the configuration of a pulse current generation circuit according to the fifth embodiment. As shown in FIG. 7, the pulse current generation circuit includes PMOS transistor 21 and NMOS transistors 22 and 23 connected in series between the power supply 1 and the ground (GND), an NMOS transistor 24 connected in parallel with the NMOS transistors 22 and 23, and a bias voltage source 25. A laser diode 13 is connected between an IC output terminal 11 and an external power supply 12. The external snubber circuit 107 as shown in FIG. 19 is not provided.

The PMOS transistor 21 is connected at its source electrode to the power supply 1, and connected at its drain electrode to the IC output terminal 11 and to drain electrodes of the NMOS transistors 22 and 24. A narrow pulse of a negative polarity (correction pulse "b") is applied to the PMOS transistor 21 at its gate electrode.

A bias voltage of a positive polarity from the bias voltage source 25 is applied to the NMOS transistor 22 at its gate electrode. The NMOS transistor 22 is connected at its source electrode to the NMOS transistor 23 at its drain electrode. The NMOS transistor 23 is connected at its source electrode to the ground (GND). An input pulse "a" having a predetermined pulse width is applied to the NMOS transistor 23 at its gate electrode. The NMOS transistor 24 is connected at its source electrode to the ground (GND). A narrow pulse of a positive polarity (correction pulse "c") is applied to the NMOS transistor 24 at its gate electrode.

In short, as understood from comparison with FIG. 1, the pulse current generation circuit has a configuration obtained by omitting the PMOS transistor 3, the bias voltage source 8, the NMOS transistor 6, and the bias voltage source 10 from the pulse current generation circuit of the first embodiment.

Figure 8:
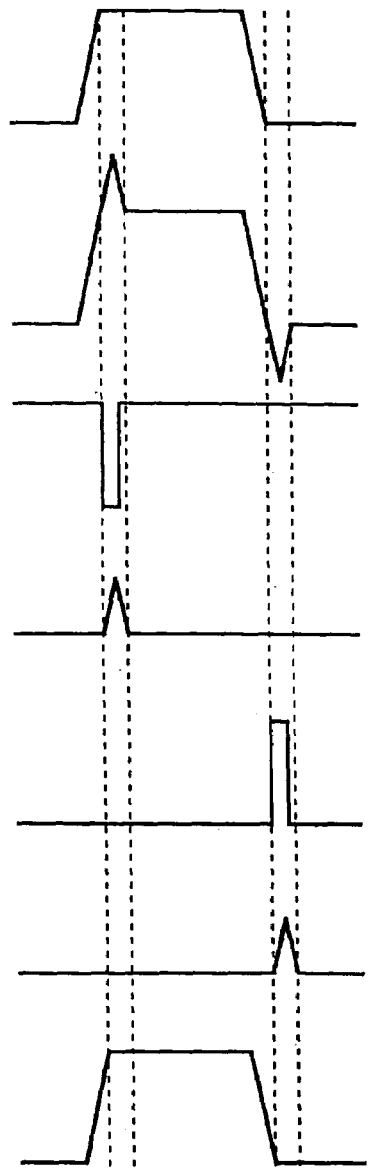
FIG. 8 is a waveform diagram that explains an operation of the pulse current generation circuit shown in FIG. 7.

Operation of the pulse current generation circuit of the fifth embodiment will now be explained with reference to FIGS. 7 and 8. FIG. 8 is a waveform diagram that explains the operation of the pulse current generation circuit shown in FIG. 7.

The bias voltage of the positive polarity from the bias voltage source 25 is applied to the gate electrode of the NMOS transistor 22. The NMOS transistor 22 is in the ON operation state, and the NMOS transistor 22 forms a constant current source that flows a preset constant current.

The input pulse "a" of the positive polarity as shown in (1) of FIG. 8 is applied to the gate electrode of the NMOS transistor 23. As a result, the constant current source formed of the NMOS transistor 22 is turned ON/OFF, and a pulse current is generated. As shown in (2) of FIG. 8, an overshoot occurs on a rising edge of the waveform of the pulse current (the output current of the NMOS transistor 22) and an undershoot occurs on a falling edge.

At the overshoot occurrence timing of the output current of the NMOS transistor 22, therefore, a narrow pulse of a negative polarity (the correction pulse "b") as shown in (3) of FIG. 8 is applied to the gate electrode of the PMOS transistor 21. As a result, a current that has a waveform corresponding to the overshoot that has occurred on the rising edge of the output current of the NMOS transistor 22 is obtained in the output current of the PMOS transistor 21 as shown in (4) of FIG. 8. By adding the output current of the NMOS transistor 22 and the output current of the PMOS transistor 21 together, the overshoot that has occurred on the rising edge of the output current of the NMOS transistor 22 is reduced, because currents caused by switching in opposite directions are added.

At the undershoot occurrence timing of the output current of the NMOS transistor 22, a narrow pulse of a positive polarity (the correction pulse "c") as shown in (5) of FIG. 8 is applied to the gate electrode of the NMOS transistor 24. As a result, a current that has a waveform corresponding to the undershoot that has occurred on the falling edge of the output current of the NMOS transistor 22 is obtained in the output current of the NMOS transistor 24 as shown in (6) of FIG. 8. By adding the output current of the NMOS transistor 22 and the output current of the NMOS transistor 24 together, the undershoot that has occurred on the falling edge of the output current of the NMOS transistor 22 is reduced.

A composite output pulse current output to the IC output terminal 11 has a waveform remarkably improved in overshoot and undershoot as shown in (7) of FIG. 8.

When forming a constant current source by using a MOS transistor, the transistor size becomes large, resulting in increased parasitic capacitance. In the first embodiment (FIG. 1), a current drawn when the PMOS transistor 2 turns ON and a current that charges the parasitic capacitance when the PMOS transistor 2 turns OFF need to be large. In the first embodiment (FIG. 1), therefore, it is difficult to improve the slew rate. Further, there is a drawback of an increased number of components to the configuration of first embodiment (FIG. 1).

In the fifth embodiment, the constant current source formed of the PMOS transistor 3 shown in the first embodiment (FIG. 1) is omitted, and a current that improves the overshoot is generated by the ON/OFF operation of the PMOS transistor 21. As a result, the number of components can be reduced and the slew rate can be made high.

Figure 9:
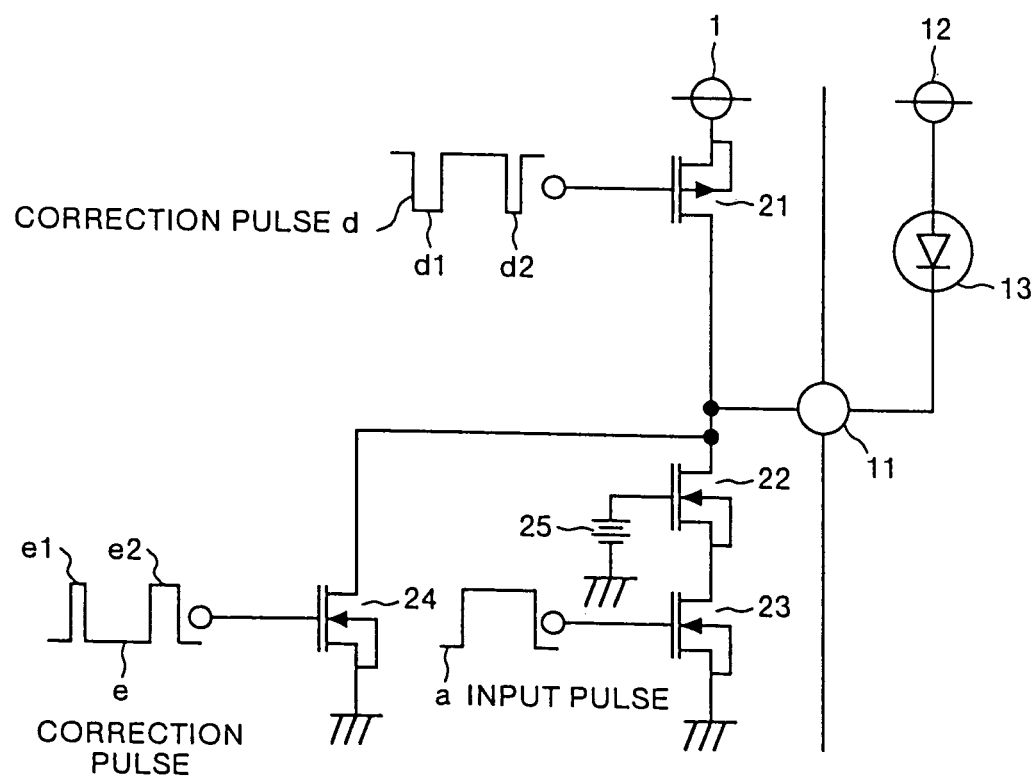
FIG. 9 is a circuit diagram that shows a configuration of a pulse current generation circuit according to a sixth embodiment of the present invention.

A sixth embodiment of this invention will be explained below. FIG. 9 is a circuit diagram that shows the configuration of a pulse current generation circuit according to the sixth embodiment. In FIG. 9, components that are the same as or equivalent to those shown in the fifth embodiment (FIG. 7) are denoted by like characters. A portion that concerns the sixth embodiment will now be explained mainly.

As shown in FIG. 9, the pulse current generation circuit of the sixth embodiment has the same configuration as that of the fifth embodiment (FIG. 7). A different point in the configuration from that of the fifth embodiment is that a correction pulse "d" is used instead of the correction pulse "b" as the correction pulse of the negative polarity applied to the gate electrode of the PMOS transistor 21 and a correction pulse "e" is used instead of the correction pulse "c" as the correction pulse of the positive polarity applied to the gate electrode of the NMOS transistor 24.

The correction pulse "e" includes a first pulse e1 that has a narrow pulse width and a second pulse e2 that has a wide pulse width. The first pulse e1 is applied at the timing of occurrence of the overshoot, which appears in the output pulse current. The second pulse e2 is applied at the timing of occurrence of the undershoot.

Figure 10:
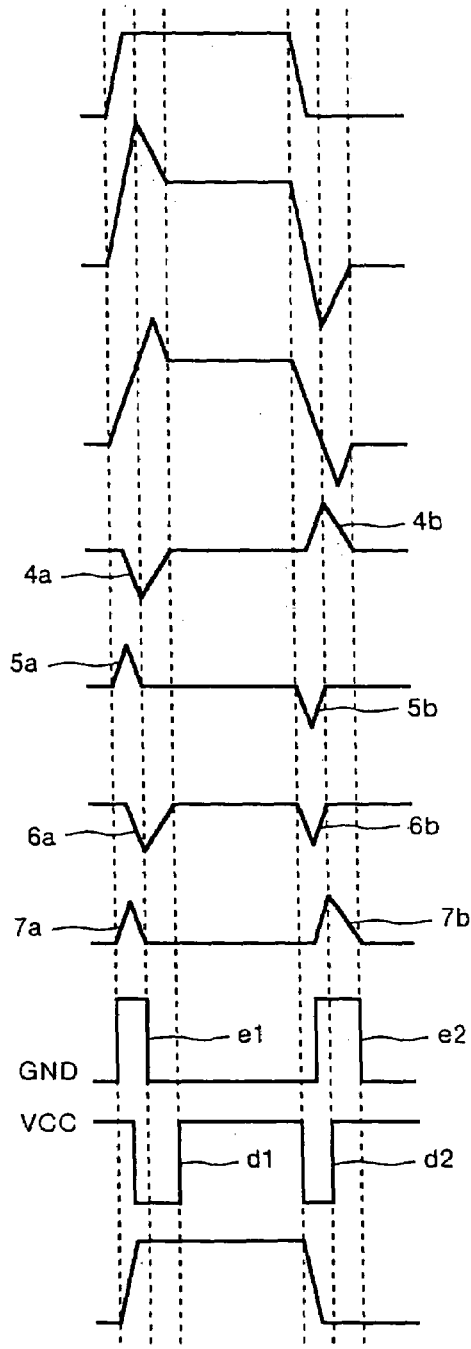
FIG. 10 is a waveform diagram that explains an operation of the pulse current generation circuit shown in FIG. 9.

Operation of the pulse current generation circuit of the sixth embodiment will now be explained with reference to FIGS. 9 and 10. FIG. 10 is a waveform diagram that shows the operation of the pulse current generation circuit shown in FIG. 9.

The bias voltage of the positive polarity from the bias voltage source 25 is applied to the gate electrode of the NMOS transistor 22. The NMOS transistor 22 is in the ON operation state, and the NMOS transistor 22 forms a constant current source that flows a preset constant current.

The input pulse "a" of the positive polarity as shown in (1) of FIG. 10 is applied to the gate electrode of the NMOS transistor 23. As a result, the constant current source formed of the NMOS transistor 22 is turned ON/OFF, and a pulse current is generated. As shown in (3) of FIG. 10, an overshoot occurs on a rising edge of the waveform of the pulse current (the output current of the NMOS transistor 22) and an undershoot occurs on a falling edge.

The correction pulse "e" that has a waveform shown in (8) of FIG. 10 is applied to the gate electrode of the NMOS transistor 24. The correction pulse "d" that has a waveform shown in (9) of FIG. 10 is applied to the gate electrode of the PMOS transistor 21. On a rising edge of the input pulse "a", the following operation is conducted.

The first pulse e1 of the correction pulse "e" rises in synchronism with the rising edge of the input pulse "a". The first pulse e1 has a waveform that falls immediately after the input pulse "a" has risen and that is comparatively narrow in pulse width. An output current of the NMOS transistor 24 as represented by 7a in (7) of FIG. 10 is generated by the first pulse e1.

On the other hand, the first pulse d1 of the correction pulse "d" has a waveform that falls after a rising edge of the first pulse e1 and rises when a certain time of period has elapsed after the rising of the input pulse "a" and that is comparatively wide in pulse width. An output current of the PMOS transistor 21 as represented by 6a in (6) of FIG. 10 is generated by the first pulse d1.

Since the first pulse e1 is applied before the first pulse d1, the output current 7a generated by the first pulse e1 is added to a current generated by the input pulse "a" shown in (3) of FIG. 10, as a speed-up current 5a shown in (5) of FIG. 10. The generation timing of the speed-up current 5a precedes the generation timing of the overshoot. As shown in (2) of FIG. 10, therefore, the rising edge of the output pulse current becomes steep and the waveform becomes such that the overshoot quantity increases.

Thereafter, the output current 6a generated by the first pulse d1 is added to the output pulse current increased in overshoot quantity ((2) of FIG. 10) as an overshoot improvement current 4a shown in (4) of FIG. 10. The pulse width of the first pulse d1 is made wide to such a degree that a current quantity required to reduce the overshoot is obtained.

The first pulse e1 and the first pulse d1 overlap each other. There is a time period during which the NMOS transistor 24 and the PMOS transistor 21 are in the ON state simultaneously. Therefore, the speed-up in the rising and the overshoot reduction are executed as a series of consecutive operations.

On the falling edge of the input pulse "a", the following operation is conducted. The second pulse d2 of the correction pulse "d" has a waveform that falls in synchronism with the falling edge of the input pulse "a" and rises immediately after the input pulse "a" has fallen and that is comparatively narrow in pulse width. An output current of the NMOS transistor 21 as represented by 6b in (6) of FIG. 10 is generated by the second pulse d2.

On the other hand, the second pulse e2 of the correction pulse "e" has a waveform that falls after the falling edge of the second pulse d2 and falls when a certain time of period has elapsed after the falling of the input pulse "a" and that is comparatively wide in pulse width. An output current of the NMOS transistor 24 as represented by 7b in (7) of FIG. 10 is generated by the second pulse e2.

Since the second pulse d2 is applied before the second pulse e2, the output current 6b generated by the second pulse d2 is added to a current generated by the input pulse "a" shown in (3) of FIG. 10, as a speed-up current 5b shown in (5) of FIG. 10. The generation timing of the speed-up current 5b precedes the generation timing of the undershoot. As shown in (2) of FIG. 10, therefore, the falling edge of the output pulse current becomes steep and the waveform becomes such that the undershoot quantity increases.

Thereafter, the output current 7b generated by the second pulse e2 is added to the output pulse current increased in undershoot quantity ((2) of FIG. 10) as an undershoot improvement current 4b shown in (4) of FIG. 10. The pulse width of the second pulse e2 is made wide to such a degree that a current quantity required to reduce the undershoot is obtained.

The second pulse e2 and the second pulse d2 overlap each other. There is a time period during which the NMOS transistor 24 and the PMOS transistor 21 are in the ON state simultaneously. Therefore, the speed-up in the falling and the undershoot reduction are executed as a series of consecutive operations.

Thus, in the pulse current generation circuit of the sixth embodiment, the slew rate of the composite output pulse current waveform is increased in addition to the improvement of the overshoot and undershoot.

Figure 11:
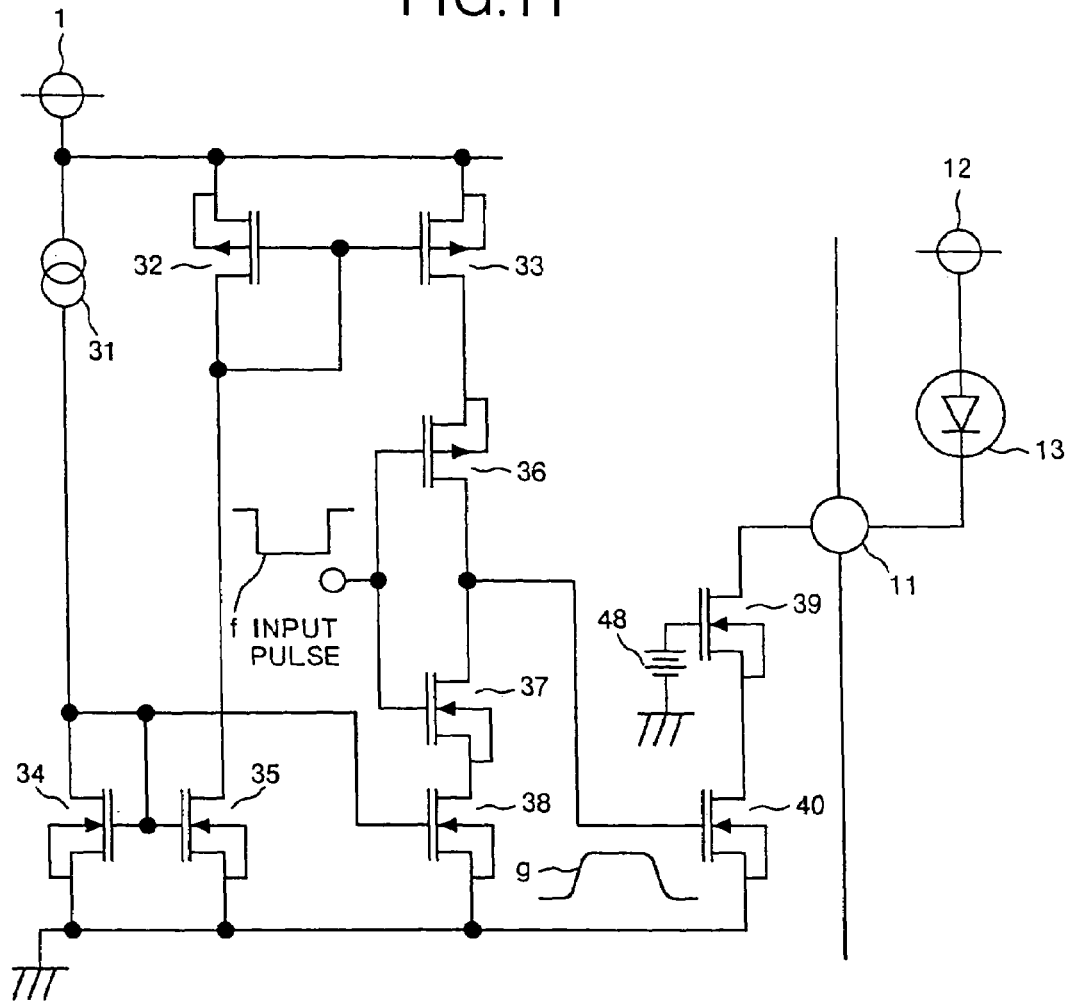
FIG. 11 is a circuit diagram that shows a configuration of a pulse current generation circuit according to a seventh embodiment of the present invention.

A seventh embodiment of this invention will be explained below. FIG. 11 is a circuit diagram that shows the configuration of a pulse current generation circuit according to the seventh embodiment. In FIG. 11, a current source 31 and source electrodes of PMOS transistors 32 and 33 which form a current mirror circuit, are connected to a line of a power supply 1. NMOS transistors 34, 35 and 38 connected at their source electrodes to ground (GND) form another current mirror circuit.

An output terminal of the current source 31 is connected to the diode-connected NMOS transistor 34 at its drain electrode and to the NMOS transistor 38 at its gate electrode. The NMOS transistor 35 is connected at its drain electrode to the diode-connected PMOS transistor 32 at its drain electrode.

The PMOS transistor 33 is connected at its drain electrode to a PMOS transistor 36 at its source electrode. The PMOS transistor 36 is connected at its drain electrode to an NMOS transistor 37 at its drain electrode, and connected to an NMOS transistor 40 at its gate electrode. Gate electrodes of the PMOS transistor 36 and the NMOS transistor 37 are connected in common to serve as an input terminal. In other words, the PMOS transistor 36 and the NMOS transistor 37 form a CMOS inverter.

The NMOS transistor 37 is connected at its source electrode to the NMOS transistor 38 at its drain electrode. An NMOS transistor 40 is connected at its source electrode to ground (GND). The NMOS transistor 40 is connected at its drain electrode to an NMOS transistor 39 at its source electrode. The NMOS transistor 39 is connected at its drain electrode to the IC output terminal 11. The NMOS transistor 39 is applied at its gate electrode with a bias voltage of a positive polarity from a bias voltage source 48. The laser diode 13 is connected to the IC output terminal 11 and the external power supply 12. The external snubber circuit 107 shown in FIG. 19 is not provided.

Figure 12:
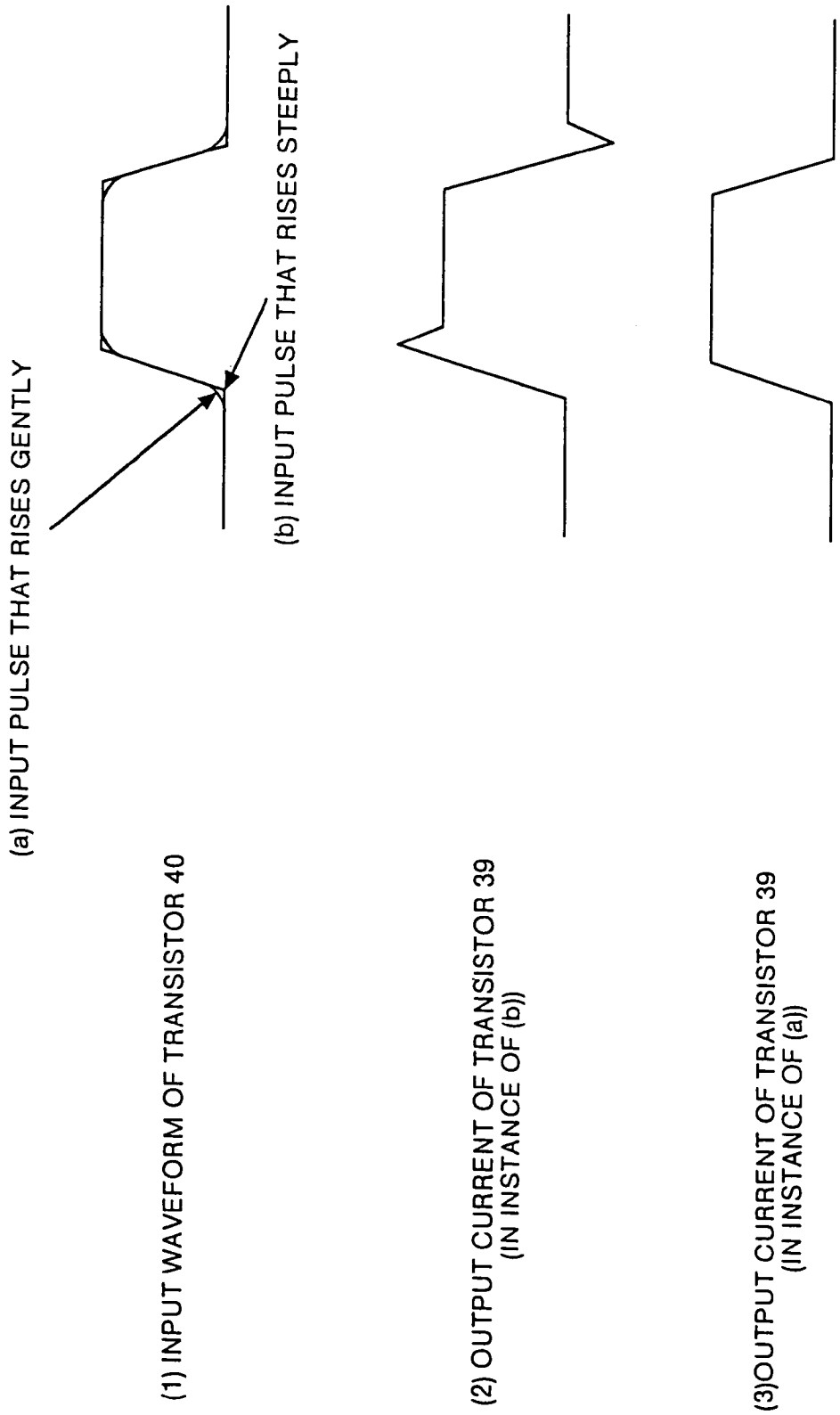
FIG. 12 is a waveform diagram that shows an operation of the pulse current generation circuit shown in FIG. 11.

Operation of the pulse current generation circuit of the seventh embodiment will now be explained with reference to FIGS. 11 and 12. FIG. 12 is a waveform diagram that shows the operation of the pulse current generation circuit shown in FIG. 11.

An output current of the current source 31 is supplied to the inverter formed of the PMOS transistor 36 and the NMOS transistor 37 via the current mirror circuit formed of the NMOS transistors 34, 35 and 38 and another current mirror circuit formed of the PMOS transistors 32 and 33.

An input pulse f is applied to an input terminal of the CMOS inverter (the PMOS transistor 36 and the NMOS transistor 37). The input pulse f falls from a high level to a low level, stays at the low level for a predetermined period of time, and then rises to the high level. An output of the CMOS inverter formed of the PMOS transistor 36 and the NMOS transistor 37 is applied to the gate electrode of the NMOS transistor 40. As a result, the NMOS transistor 40 turns ON/OFF.

The bias voltage of the positive polarity from the bias voltage source 48 is applied to the gate electrode of the NMOS transistor 39. The NMOS transistor 39 is thus in the ON operation state, and forms a constant current source that flows a preset constant current. A pulse current is generated by the ON/OFF operation of the NMOS transistor 40.

When the input terminal of the CMOS inverter formed of the PMOS transistor 36 and the NMOS transistor 37 is at a high level, the PMOS transistor 36 is in the OFF operation state and the NMOS transistor 37 is in the ON operation state. Since the NMOS transistor 38 is in the ON operation state, the NMOS transistor 40 maintains the OFF operation state.

When the input terminal is at a low level, the NMOS transistor 37 is in the OFF operation state and the PMOS transistor 36 is in the ON operation state. Therefore, the NMOS transistor 40 is in the ON operation state.

One of causes of the overshoot and undershoot is that the slew rate of the input pulse is too high. When the slew rate of the input pulse is too high, the impedance caused by the high frequency component of the output pulse current and inductance becomes high. Thus, counter electromotive force is generated by the output pulse current, and the overshoot and the undershoot occur.

In the seventh embodiment, therefore, it is made possible to increase and decrease current quantities of the current source 31, the current mirror circuit formed of the PMOS transistors 32 and 33, and another current mirror circuit formed of the NMOS transistors 34, 35 and 38. As a result, it becomes possible to effect an adjustment on the switching speed of the NMOS transistor 40 in order to decrease the steepness of the rising edge and falling edge of the input waveform of the NMOS transistor 40 to such a degree that the overshoot and undershoot do not occur.

To be concrete, when the current quantities of the current source 31 and so on have been adjusted so as to make the input waveform of the NMOS transistor 40 become a waveform that has a gentle rising edge as indicated by (a) in (1) of FIG. 12, the overshoot and undershoot do not appear in the waveform of the output current of the NMOS transistor 39 as shown in (3) of FIG. 12.

On the other hand, when the current quantities of the current source 31 and so on have been adjusted so as to make the input waveform of the NMOS transistor 40 become a waveform that has a sharp rising edge as indicated by (b) in (1) of FIG. 12, the overshoot and undershoot appear in the waveform of the output current of the NMOS transistor 39 as shown in (2) of FIG. 12.

Thus, in the pulse current generation circuit of the seventh embodiment, an output pulse current improved remarkably in overshoot and undershoot is obtained by adjusting the current quantities of the current source 31, the current mirror circuit formed of the PMOS transistors 32 and 33, and the current mirror circuit formed of the NMOS transistors 34, 35 and 38. Further, since a PMOS transistor is not used in the output section, the slew rate is not aggravated.

Figure 13:
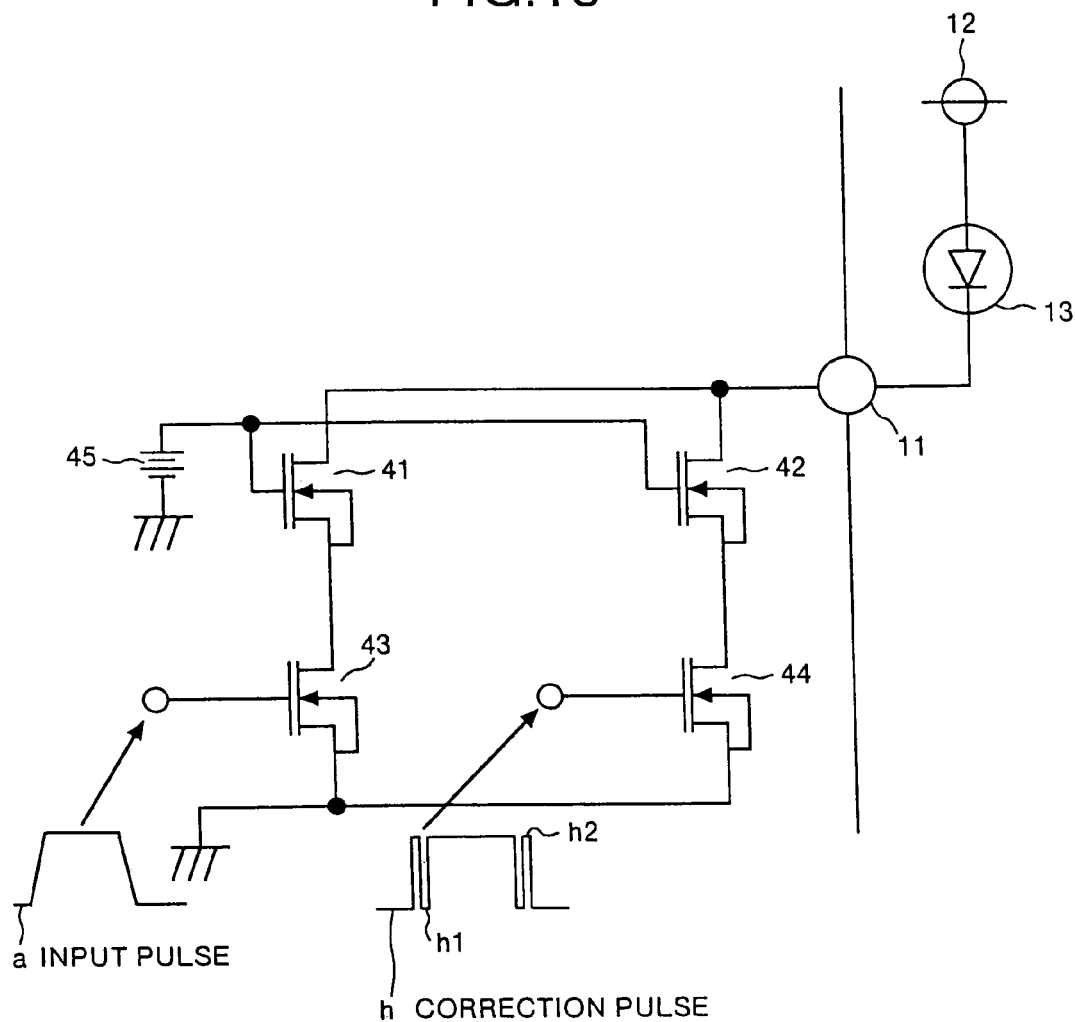
FIG. 13 is a circuit diagram that shows a configuration of a pulse current generation circuit according to an eighth embodiment of the present invention.

An eighth embodiment of this invention will be explained below. FIG. 13 is a circuit diagram that shows the configuration of a pulse current generation circuit according to the eighth embodiment. As shown in FIG. 13, the pulse current generation circuit of the eighth embodiment includes NMOS transistors 41, 42, 43 and 44 and a bias voltage source 45. The laser diode 13 is connected to the IC output terminal 11 and the external power supply 12. The external snubber circuit shown in FIG. 19 is not provided.

The NMOS transistors 41 and 42 are connected at their drain electrodes to the IC output terminal 11. A bias voltage of a positive polarity from a common bias voltage source 45 is applied to gate electrodes of the NMOS transistors 41 and 42. In other words, each of the NMOS transistors 41 and 42 forms a constant current source.

The NMOS transistor 43 is connected at its drain electrode to the NMOS transistor 41 at its source electrode. The NMOS transistor 43 is connected at its source electrode to ground (GND). An input pulse "a" is applied to the NMOS transistor 43 at its gate electrode.

The NMOS transistor 44 is connected at its drain electrode to the NMOS transistor 42 at its source electrode. The NMOS transistor 44 is connected at its source electrode to the ground (GND). A correction pulse "h" is applied to the NMOS transistor 44 at its gate electrode.

The correction pulse "h" rises on its front edge of the pulse, then falls, and rises again to form a valley portion h1. On its rear edge, the correction pulse "h" falls, then rises, and falls again to form a hill portion h2. The valley portion h1 is formed in the region where overshoot occurs, and the hill portion h2 is formed in the region where undershoot occurs.

Figure 14:
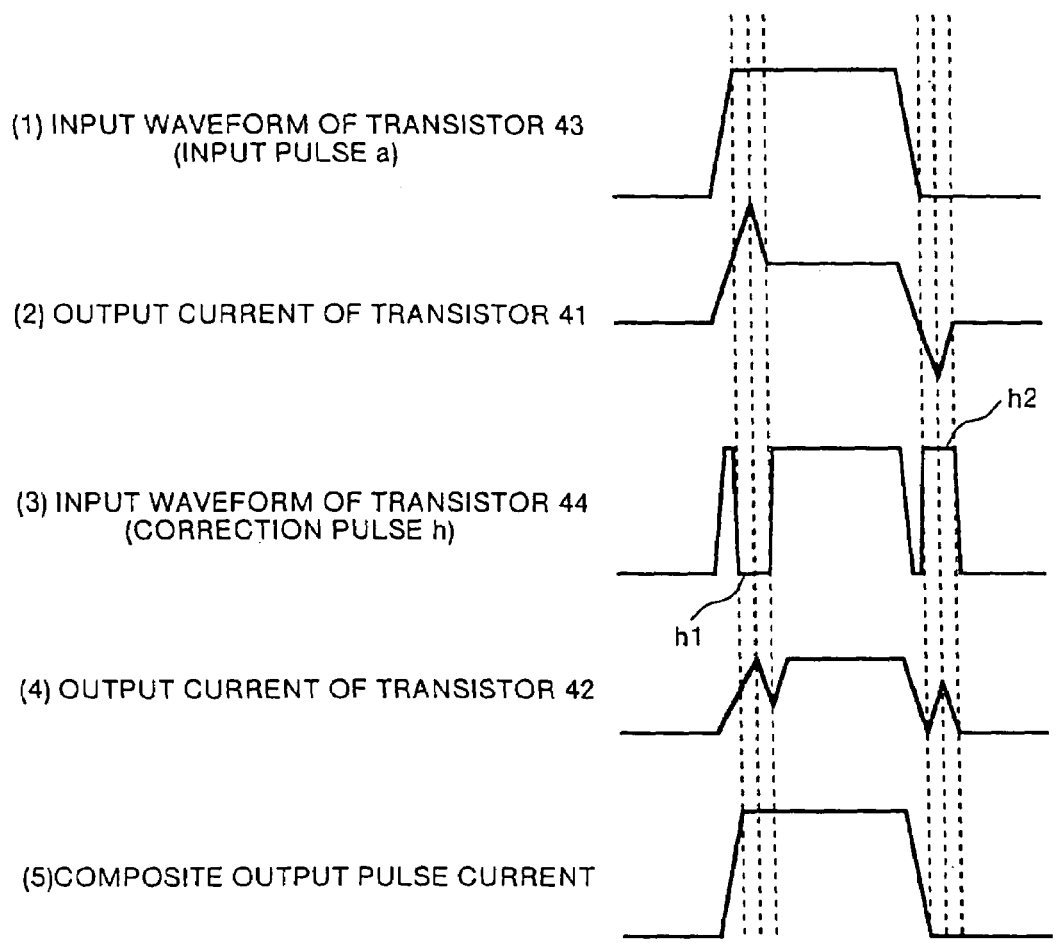
FIG. 14 is a waveform diagram that explains an operation of the pulse current generation circuit shown in FIG. 13.

Operation of the pulse current generation circuit of the eighth embodiment will now be explained with reference to FIGS. 13 and 14. FIG. 14 is a waveform diagram that explains the operation of the pulse current generation circuit shown in FIG. 13.

The gate electrodes of the NMOS transistors 41 and 42 are applied with the bias voltage of the positive polarity from the common bias voltage source 45. Each of the NMOS transistors 41 and 42 is thus in the ON operation state, and forms a constant current source. Pulse currents are output from the NMOS transistors 41 and 42 by ON/OFF operation of the NMOS transistors 43 and 44. Output pulse currents of the NMOS transistors 41 and 42 are combined and output to the IC output terminal 11.

The input pulse "a" of the positive polarity as shown in (1) of FIG. 14 is applied to the gate electrode of the NMOS transistor 43. As a result, the constant current source formed of the NMOS transistor 41 is turned ON/OFF, and a pulse current is generated. As shown in (2) of FIG. 14, an overshoot occurs on a rising edge of the waveform of the pulse current (the output current of the NMOS transistor 41) and an undershoot occurs on a falling edge.

The correction pulse "h" that has a waveform shown in (3) of FIG. 14 is applied to the gate electrode of the NMOS transistor 41. The correction pulse "h" rises in synchronism with a rising edge of the input pulse "a". At immediately subsequent timing of overshoot occurrence, the correction pulse "h" falls, and then rises again in synchronism with the timing of overshoot termination. On the front edge of the pulse, the valley portion hi is thus formed in the region of the overshoot occurrence.

As shown in (2) and (4) of FIG. 14, therefore, the output current of the NMOS transistor 42 that corresponds to the front edge section of the correction pulse "h" becomes opposite in phase to the overshoot section of the output current of the NMOS transistor 41. In the pulse current obtained by combining the output currents of the NMOS transistors 41 and 42, therefore, the overshoot is reduced.

As shown in (3) of FIG. 14, the correction pulse "h" falls once on it rear edge in synchronism with a falling edge of the input pulse "a". At immediately subsequent timing of undershoot occurrence, the correction pulse "h" rises, and then falls again in synchronism with the timing of undershoot termination. As a result, the hill portion h2 is formed.

As shown in (2) and (4) of FIG. 14, therefore, the output current of the NMOS transistor 42 that corresponds to the rear edge section of the correction pulse "h" becomes opposite in phase to the undershoot section of the output current of the NMOS transistor 41. In the pulse current obtained by combining the output currents of the NMOS transistors 41 and 42, therefore, the undershoot is reduced.

In the pulse current generation circuit of the eighth embodiment, it becomes possible to conduct correction of the overshoot and undershoot with neither an excess nor insufficiency by adjusting the transistor sizes of the NMOS transistors 41 and 42 that form the constant current sources so as to obtain desired DC current values. Further, since a PMOS transistor is not used in the output section, the slew rate is not aggravated.

Figure 15:
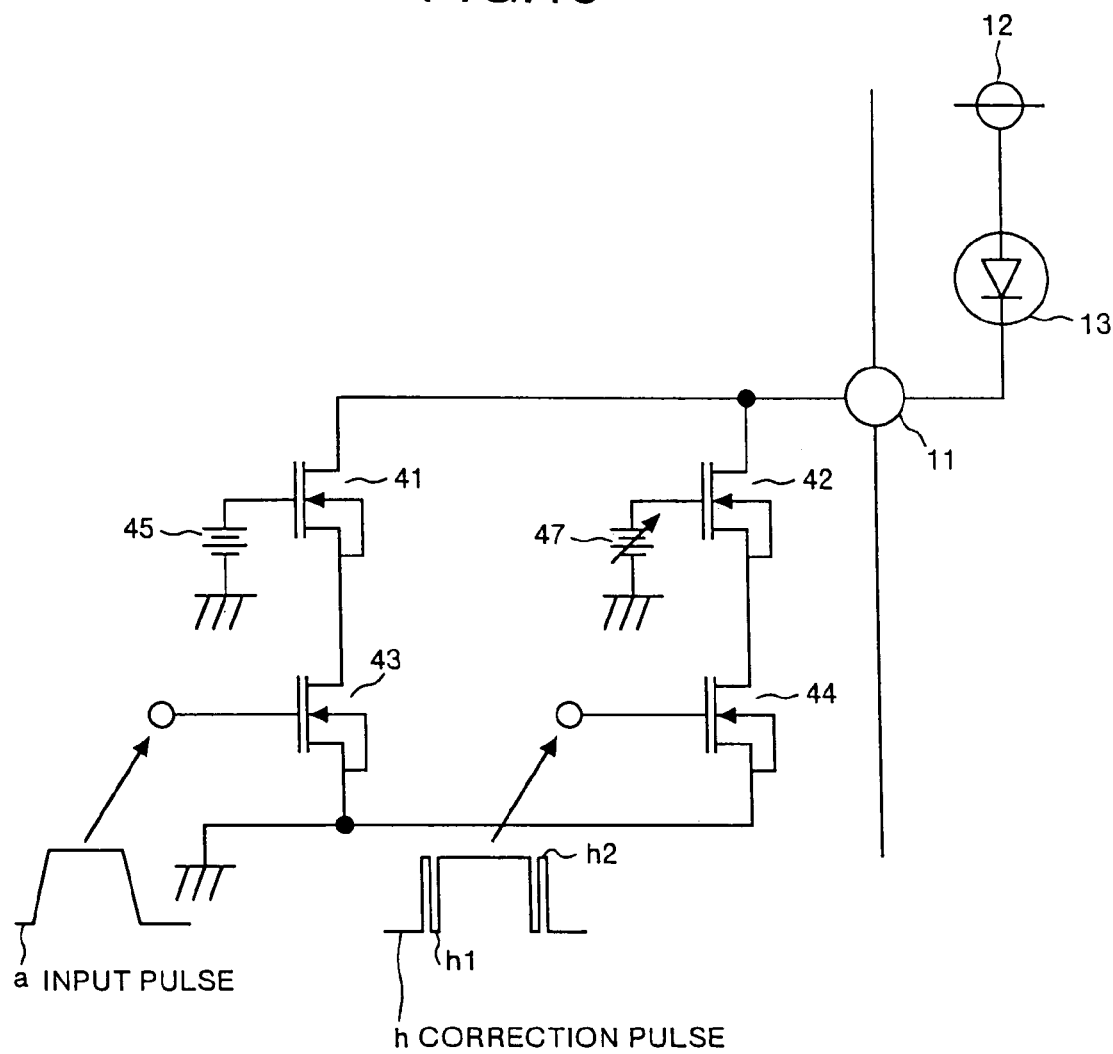
FIG. 15 is a circuit diagram that shows a configuration of a pulse current generation circuit according to a ninth embodiment of the present invention.

A ninth embodiment of this invention will be explained below. FIG. 15 is a circuit diagram that shows the configuration of a pulse current generation circuit according to the ninth embodiment. In FIG. 15, components that are the same as or equivalent to those shown in the eighth embodiment (FIG. 13) are denoted by like characters. A portion that concerns the ninth embodiment will now be explained mainly.

As shown in FIG. 15, the pulse current generation circuit of the ninth embodiment has the same configuration as that of the eighth embodiment (FIG. 13) except that the NMOS transistors 41 and 42 are provided with respective bias voltage sources. That is, the NMOS transistor 41 is provided with the fixed valued bias voltage source 45 shown in the eighth embodiment (FIG. 13), and the NMOS transistor 42 is provided with a variable bias voltage source 47.

Figure 16:
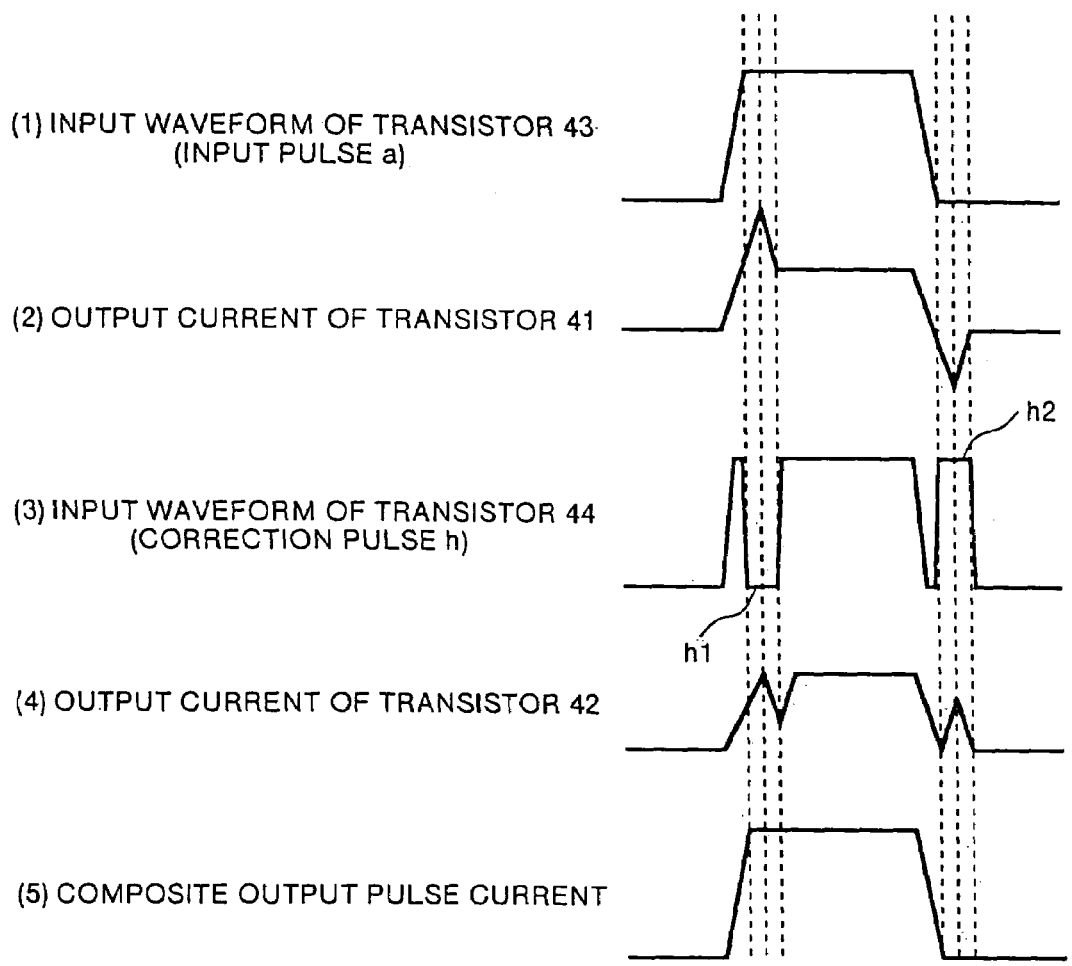
FIG. 16 is a waveform diagram that explains an operation of the pulse current generation circuit shown in FIG. 15.

Operation of the pulse current generation circuit of the ninth embodiment will now be explained with reference to FIGS. 15 and 16. FIG. 16 is a waveform diagram that shows the operation of the pulse current generation circuit shown in FIG. 15.

A bias voltage of a fixed value and a positive polarity from the bias voltage source 45 is applied to the gate electrode of the NMOS transistor 41. The NMOS transistor 41 is in the ON operation state, and the NMOS transistor 41 forms a constant current source of a fixed value. On the other hand, a variably set bias voltage of a positive polarity from the variable bias voltage source 47 is applied to the gate electrode of the NMOS transistor 42. The NMOS transistor 42 is in the ON operation state, and the NMOS transistor 42 forms a variable constant current source. Pulse currents are output from the NMOS transistors 41 and 42 by ON/OFF operation of the NMOS transistors 43 and 44, respectively. The output pulse currents of the NMOS transistors 41 and 42 are combined and output to the IC output terminal 11.

Operation of the ninth embodiment is similar to that of the eighth embodiment (FIG. 14). In FIG. 16, (1) shows an input waveform (input pulse "a") of the NMOS transistor 43, (2) shows an output current waveform of the NMOS transistor 41, (3) shows an input waveform (correction pulse "h") of the NMOS transistor 44, (4) shows an output current waveform of the NMOS transistor 42, and (5) shows an output pulse current waveform obtained by combining the output current of the NMOS transistor 41 and the output current of the NMOS transistor 42.

In the ninth embodiment, it becomes possible to conduct correction of the overshoot and undershoot with neither an excess nor insufficiency by adjusting the bias voltage of the variable bias voltage source 47 and thereby suitably setting and operating the correction current quantity of the NMOS transistor 42, which forms a constant current source, i.e., the amplitude level of the waveform shown in (4) of FIG. 16.

Thus, in the pulse current generation circuit of the ninth embodiment, the correction current is made adjustable and consequently the overshoot and undershoot correction can be effected arbitrarily even during its use.

Figure 17:
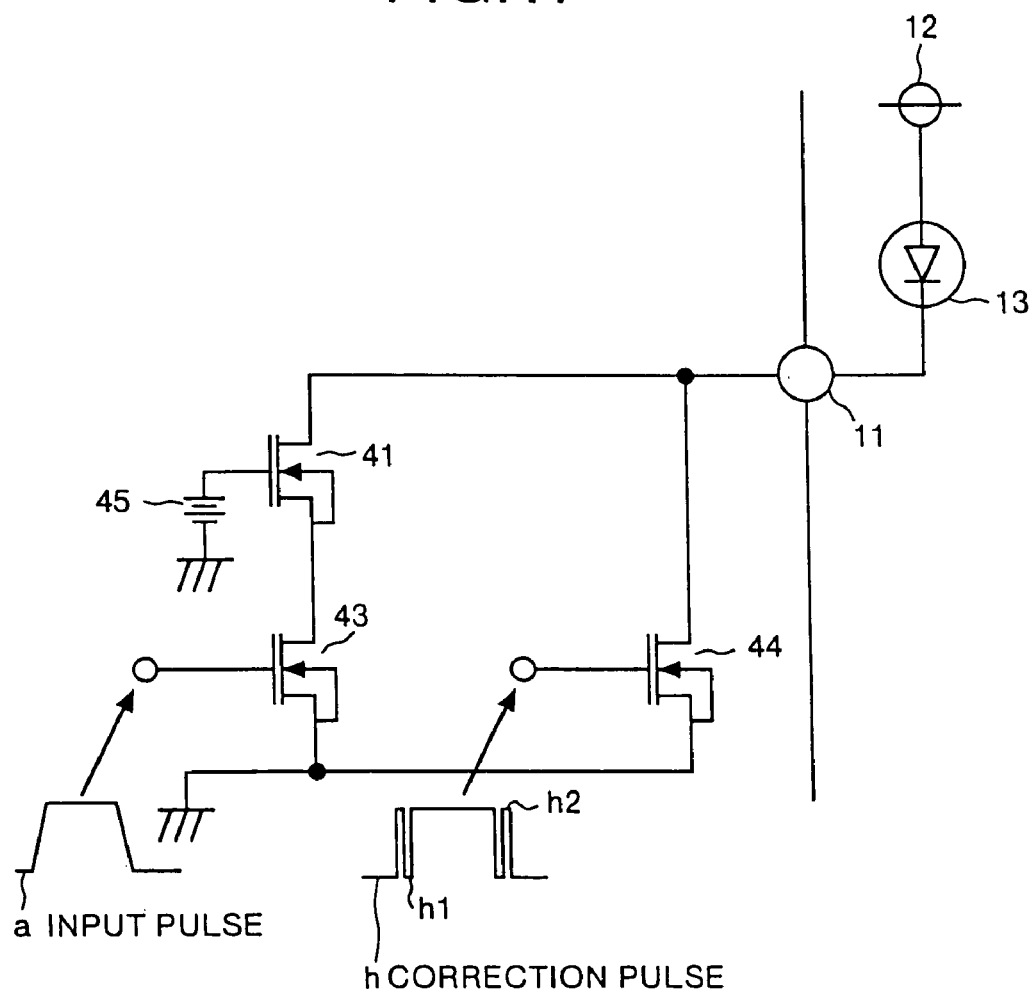
FIG. 17 is a circuit diagram that shows a configuration of a pulse current generation circuit according to a tenth embodiment of the present invention.

A tenth embodiment of this invention will be explained below. FIG. 17 is a circuit diagram that shows the configuration of a pulse current generation circuit according to the tenth embodiment. In FIG. 17, components that are the same as or equivalent to those shown in the eighth embodiment (FIG. 13) are denoted by like characters. A portion that concerns the tenth embodiment will now be explained mainly.

As shown in FIG. 17, the pulse current generation circuit of the tenth embodiment has the same configuration as that of the eighth embodiment (FIG. 13) except that the NMOS transistor 42 is omitted and the drain electrode of the NMOS transistor 44 is connected to the IC output terminal 11 together with the drain electrode of the NMOS transistor 41.

In other words, the correction current is generated by only ON resistance of the NMOS transistor 44. A required correction current quantity is determined by adjusting the transistor size of the NMOS transistor 44, which conducts the switching operation according to the correction pulse "h".

Figure 18:
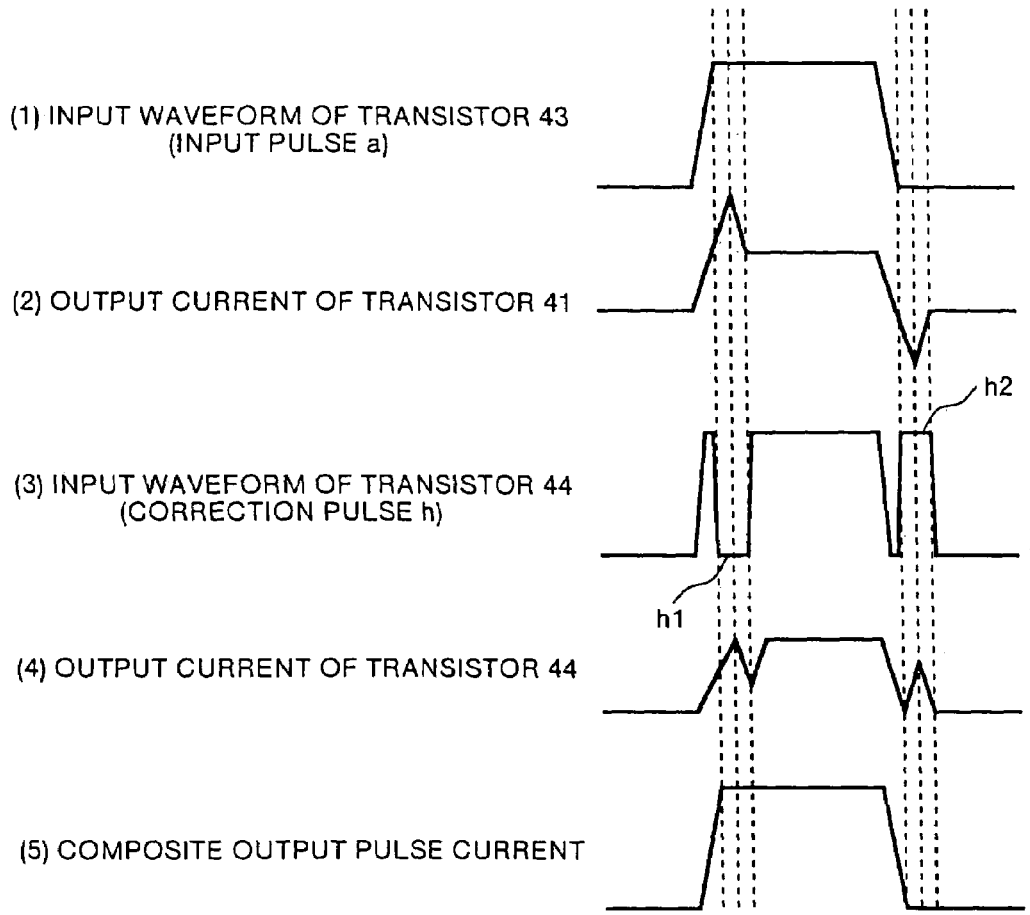
FIG. 18 is a waveform diagram that explains an operation of the pulse current generation circuit shown in FIG. 17.

Operation of the pulse current generation circuit of the tenth embodiment will now be explained with reference to FIGS. 17 and 18. FIG. 18 is a waveform diagram that shows the operation of the pulse current generation circuit shown in FIG. 17.

The operation of the tenth embodiment is similar to that of the eighth embodiment (FIG. 14). In FIG. 18, (1) shows an input waveform (input pulse "a") of the NMOS transistor 43, (2) shows an output current waveform of the NMOS transistor 41, (3) shows an input waveform (correction pulse "h") of the NMOS transistor 44, (4) shows an output current waveform of the NMOS transistor 44, and (5) shows an output pulse current waveform obtained by combining the output current of the NMOS transistor 41 and the output current of the NMOS transistor 44.

In the pulse current generation circuit of the tenth embodiment, it becomes possible to conduct correction of the overshoot and undershoot with neither an excess nor insufficiency by adjusting the transistor sizes of the NMOS transistor that conducts the switching operation according to the correction pulse so as to obtain a desired DC current value. Further, since a PMOS transistor is not used in the output section, the slew rate is not aggravated. In addition, the number of components can be reduced.

In the respective embodiments, the pulse current generation circuits formed of the MOS transistors are shown and configurations using bipolar transistors have been omitted. However, it is a matter of course that any of the first to six and eighth to tenth embodiments can be formed of bipolar transistors as well.

As heretofore explained, according to the one aspect of the invention, the first N-type transistor connected at the first signal electrode thereof to the output terminal of an output pulse current functions as the first constant current source according to a bias voltage of the positive polarity. The second N-type transistor connected to the second signal electrode of the first N-type transistor and ground switches a current of the first constant current source in response to the input pulse of the positive polarity and thus generates the output pulse current where an overshoot and an undershoot appear. Therefore, the first P-type transistor connected at the first signal electrode thereof to the output terminal is made to function as the second constant current source according to the bias voltage of the negative polarity. The first correction pulse of the negative polarity is applied to the second P-type transistor connected to the second signal electrode of the first P-type transistor and the power supply at timing of occurrence of the overshoot in the output pulse current in order to switch the current of the second constant current source and thus generate the first correction pulse current. As a result, the first correction current and the output pulse current are added together. Thus, the output pulse current improved in overshoot is output from the output terminal. Further, the third N-type transistor connected at the first signal electrode thereof to the output terminal is made to function as the third constant current source according to the bias voltage of the positive polarity. The second correction pulse of the positive polarity is applied to the fourth N-type transistor connected to the second signal electrode of the third N-type transistor and ground at timing of occurrence of the undershoot in the output pulse current in order to switch the current of the third constant current source and thus generate the second correction pulse current. As a result, the second correction pulse current and the output pulse current are added together. Thus, the output pulse current improved in undershoot is output from the output terminal. Since the overshoot and undershoot can be thus improved without requiring any external component, a higher slew rate can be achieved.

According to the another aspect of the invention, the first N-type transistor connected at the first signal electrode thereof to the output terminal of an output pulse current functions as the first constant current source according to the bias voltage of the positive polarity. The second N-type transistor connected tow the second signal electrode of the first N-type transistor and ground switches the current of the first constant current source in response to an input pulse of the positive polarity and thus generates the output pulse current. An overshoot and an undershoot appear on the output pulse current. Therefore, the first P-type transistor connected at the first signal electrode thereof to the output terminal is made to function as the second constant current source according to the bias voltage of the negative polarity. The first correction pulse of the negative polarity is applied to the second P-type transistor connected to the second signal electrode of the first P-type transistor and the power supply at timing of occurrence of the overshoot in the output pulse current in order to switch the current of the second constant current source and thus generate the first correction pulse current. As a result, the first correction current and the output pulse current are added together. Thus, the output pulse current improved in overshoot is output from the output terminal. Further, the second correction pulse of the positive polarity is applied to the third N-type transistor connected to the second signal electrode of the first N-type transistor and ground at timing of occurrence of the undershoot in the output pulse current in order to switch the current of the first constant current source and thus generate the second correction pulse current. As a result, the second correction pulse current and the output pulse current are added together. Thus, the output pulse current improved in undershoot is output from the output terminal. Since the overshoot and undershoot can be thus improved without requiring any external component, a higher slew rate can be achieved.

Moreover, each of the first P-type transistor and the third N-type transistor receives a variable bias voltage from the variable bias voltage source to form the variable constant current source. As a result, the correction pulse current can be adjusted. Therefore, appropriate improvement of the overshoot and undershoot can be effected.

According to the still another aspect of the invention, the first N-type transistor connected at the first signal electrode thereof to the output terminal of an output pulse current functions as the first constant current source according to the bias voltage of the positive polarity. The second N-type transistor connected to the second signal electrode of the first N-type transistor and ground switches a current of the first constant current source in response to the input pulse of the positive polarity and thus generates the output pulse current, where an overshoot and an undershoot appear. Therefore, the first correction pulse of the negative polarity is applied to the P-type transistor connected to the power supply and the output terminal at timing of occurrence of the overshoot in the output pulse current in order to switch the current of the second constant current source and thus generate the first correction pulse current. As a result, the first correction current and the output pulse current are added together. Thus, the output pulse current improved in overshoot is output from the output terminal. Further, the second correction pulse of the positive polarity is applied to the third N-type transistor connected to the output terminal and the ground at timing of occurrence of the undershoot in the output pulse current in order to conduct the switching operation and thus generate the second correction pulse current. As a result, the second correction pulse current and the output pulse current are added together. Thus, the output pulse current improved in undershoot is output from the output terminal. Since the overshoot and undershoot can be thus improved without requiring any external component, a higher slew rate can be achieved.

Furthermore, the first correction pulse includes two negative pulses. One of the pulses has a wide pulse width generated at timing of occurrence of the overshoot in the output pulse current, and the other has a narrow pulse width generated at timing of occurrence of the undershoot. The second correction pulse includes two positive pulses. One of the pulses has a narrow pulse width generated at timing of occurrence of the overshoot in the output pulse current, and the other has a wide pulse width generated at timing of occurrence of the undershoot. Thus, operation of increasing the overshoot and undershoot and then effecting an improvement on each of the overshoot and undershoot is conducted. As a result, a further higher slew rate can be achieved.

According to the still another aspect of the invention, the first N-type transistor connected at the first signal electrode thereof to the output terminal of an output pulse current functions as the constant current source according to the bias voltage of the positive polarity. The second N-type transistor connected to the second signal electrode of the first N-type transistor and ground receives the output of the CMOS inverter that inverts the input pulse applied thereto and outputs the inverted pulse, switches the current of the constant current source, and thus generates the output pulse current. An overshoot and an undershoot may appear or may not appear on the output pulse current depending on a switching speed of the second N-type transistor. Therefore, it becomes possible to prevent the overshoot and undershoot from appearing on the output pulse current, by adjusting the current quantities of the current source and the current mirror circuits that supply the current to the CMOS inverter and thereby setting the switching speed of the second N-type transistor suitably.

According to the still another aspect of the invention, the first and second N-type transistors each connected at the first signal electrode thereof to the output terminal of an output pulse current function respectively as the first and second constant current sources according to the bias voltage of the positive polarity. The third N-type transistor connected to the second signal electrode of the first N-type transistor and ground, switches the current of the first constant current source in response to the input pulse of the positive polarity and thus generates the output pulse current. An overshoot and an undershoot appear on the output pulse current. Therefore, the fourth N-type transistor connected to the second signal electrode of the second N-type transistor and the ground is made to conduct the switching operation in response to the correction pulse of the positive polarity provided with the valley portion at timing of occurrence of an overshoot in the output pulse current and the hill portion at timing of occurrence of an undershoot in the output pulse current, and thus generate the correction pulse current. The correction pulse current is output to the output terminal together with the output terminal. As a result, the correction pulse current and the output pulse current are added together. Thus, the output pulse current improved in overshoot and undershoot is output from the output terminal. Since the overshoot and undershoot can be thus improved without requiring any external component, a higher slew rate can be achieved.

Moreover, the first N-type transistor connected at the first signal electrode thereof to the output terminal of the output pulse current functions as the first constant current source according to the fixed bias voltage of the positive polarity. The second N-type transistor connected at the first signal electrode thereof to the output terminal of the output pulse current functions as the second constant current source according to the variable bias voltage of the positive polarity. As a result, the correction pulse current can be adjusted suitably. Therefore, appropriate improvement of the overshoot and undershoot can be effected.

According to the still another aspect of the invention, the first N-type transistor connected at the first signal electrode thereof to the output terminal of the output pulse current functions as the first constant current source according to the bias voltage of the positive polarity. The second N-type transistor connected to the second signal electrode of the first N-type transistor and ground switches the current of the first constant current source in response to the input pulse of the positive polarity and thus generates the output pulse current. An overshoot and an undershoot appear on the output pulse current. Therefore, the third N-type transistor connected to the output terminal and the ground is made to conduct the switching operation in response to the correction pulse of the positive polarity provided with the valley portion at timing of occurrence of an overshoot in the output pulse current and the hill portion at timing of occurrence of an undershoot in the output pulse current, and thus generate the correction pulse current. The correction pulse current is output to the output terminal together with the output terminal. As a result, the correction pulse current and the output pulse current are added together. Thus, the output pulse current improved in overshoot and undershoot is output from the output terminal. Since the overshoot and undershoot can be thus improved without requiring any external component, a higher slew rate can be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A pulse current generation circuit comprising:
  a first N-type transistor that is connected at a first signal electrode to an output terminal for receiving an output pulse current, and that functions as a first constant current source in response to a bias voltage having a positive polarity;
  a second N-type transistor that is connected to a second signal electrode of the first N-type transistor and to ground, and that switches a current supplied by the first constant current source in response to an input pulse having a positive polarity and thus generates the output pulse current;
  a first P-type transistor that is connected at a first signal electrode to the output terminal and that functions as a second constant current source in response to a bias voltage having a negative polarity;
  a second P-type transistor that is connected to a second signal electrode of the first P-type transistor and to a power supply, and that switches a current supplied by the second constant current source in response to a first correction pulse having a negative polarity upon occurrence of an overshoot in the output pulse current and thus generates a first correction pulse current;

a third N-type transistor that is connected at a first signal electrode to the output terminal, and that functions as a third constant current source in response to a bias voltage having a positive polarity; and a fourth N-type transistor that is connected to a second signal electrode of the third N-type transistor and to the ground, and that switches a current supplied by the third constant current source in response to a second correction pulse having a positive polarity upon occurrence of an undershoot in the output pulse current and thus generates a second correction pulse current.

2. The pulse current generation circuit according to claim 1, including a variable bias voltage source for each of the first P-type transistor and the third N-type transistor.

3. The pulse current generation circuit according to claim 1, wherein the first correction pulse includes two pulses having a negative polarity, a first of the pulses having a first pulse width and generated upon occurrence of the overshoot in the output pulse current, and a second of the pulses having a pulse width narrower than the first pulse width and generated upon occurrence of the undershoot, and the second correction pulse includes two pulses having a positive polarity, a first of the pulses having a second pulse width and generated upon occurrence of the overshoot in the output pulse current, and a second of the pulses having a pulse width wider than the second pulse width and generated upon occurrence of the undershoot.

4. A pulse current generation circuit comprising:

a first N-type transistor that is connected at a first signal electrode to an output terminal for receiving an output pulse current, and that functions as a first constant current source in response to a bias voltage having a positive polarity;

a second N-type transistor that is connected to a second signal electrode of the first N-type transistor and to ground, and that switches a current supplied by the first constant current source in response to an input pulse having a positive polarity and thus generates the output pulse current;

a first P-type transistor that is connected at a first signal electrode to the output terminal and that functions as a second constant current source in response to a bias voltage having a negative polarity;

a second P-type transistor that is connected to a second signal electrode of the first P-type transistor and to a power supply, and that switches a current supplied by the second constant current source in response to a first correction pulse having a negative polarity upon occurrence of an overshoot in the output pulse current and thus generates a first correction pulse current; and a third N-type transistor that is connected to the second signal electrode of the first N-type transistor and to the ground, and that switches a current supplied by the first constant current source in response to a second correction pulse having a positive polarity upon occurrence of an undershoot in the output pulse current and thus generates a second correction pulse current.

5. A pulse current generation circuit comprising:

a first N-type transistor that is connected at a first signal electrode to an output terminal for receiving an output pulse current, and that functions as a first constant current source in response to a bias voltage having a positive polarity;

a second N-type transistor that is connected to a second signal electrode of the first N-type transistor and to ground, and that switches a current supplied by the first constant current source in response to an input pulse having a positive polarity and thus generates the output pulse current;

a P-type transistor that is connected to a power supply and to the output terminal, and that switches in response to a first correction pulse having a negative polarity upon occurrence of on overshoot in the output pulse current and thus generates a first correction pulse current; and a third N-type transistor that is connected to the output terminal and to the ground, and that switches in response to a second correction pulse having a positive polarity upon occurrence of an undershoot in the output pulse current and thus generates a second correction pulse current.

6. The pulse current generation circuit according to claim 5, wherein the first correction pulse includes two pulses having a negative polarity, a first of the pulses having a first pulse width and generated upon occurrence of the overshoot in the output pulse current, and a second of the pulses having a pulse width narrower than the first pulse width and generated upon occurrence of the undershoot, and the second correction pulse includes two pulses having a positive polarity, a first of the pulses having a second pulse width and generated upon occurrence of the overshoot in the output pulse current, and a second of the pulses having a pulse width wider than the second pulse width and generated upon occurrence of the undershoot.

7. A pulse current generation circuit comprising:

a CMOS inverter that inverts an input pulseand outputs an inverted pulse;

a current source;

a current mirror circuit that supplies an output current of the current source to the CMOS inverter;

a first N-type transistor that is connected at a first signal electrode to an output terminal for receiving an output current, and that functions as a first constant current source in response to a bias voltage having a positive polarity; and a second N-type transistor that is connected to a second signal electrode of the first N-type transistor and to ground, and that switches a current supplied by the constant current source in response to an output of the CMOS inverter and thus generates the output pulse current.

8. A pulse current generation circuit comprising:

first and second N-type transistors that are each connected at first signal electrodes thereof to an output terminal for receiving an output pulse current, and that function respectively as first and second constant current sources in response to a bias voltage having a positive polarity;

a third N-type transistor that is connected to a second signal electrode of the first N-type transistor and to the ground, and that switches a current supplied by the first constant current source in response to an input pulse having a positive polarity and thus generates the output pulse current; and a fourth N-type transistor that is connected to a second signal electrode of the second N-type transistor and to the ground, and that switches in response to a correction pulse having a positive polarity and having a valley portion upon occurrence of an overshoot in the output pulse current and a hill portion upon occurrence of an undershoot in the output pulse current, and thus generates a correction pulse current.

9. The pulse current generation circuit according to claim 8, wherein
the first N-type transistor functions as the first constant current source in response to a fixed bias voltage having a positive polarity, and
the second N-type transistor functions as the second constant current source in response to a variable bias voltage having a positive polarity.

10. A pulse current generation circuit comprising:
a first N-type transistor that is connected at a first signal electrode to an output terminal for receiving an output pulse current, and that functions as a first constant current source in response to a bias voltage having a positive polarity;
a second N-type transistor that is connected to a second signal electrode of the first N-type transistor and to ground, and that switches a current supplied by the first constant current.

* * * * *